(12) United States Patent
Chiang et al.

(10) Patent No.: US 12,677,421 B2
(45) Date of Patent: Jul. 7, 2026

(54) MEMORY STRUCTURE INCLUDING A PLURALITY OF TRANSISTORS CONNECTED TO A STORAGE ELEMENT

(71) Applicant: TAIWAN SEMICONDUCTOR MANUFACTURING COMPANY, LTD., Hsinchu (TW)

(72) Inventors: Hung-Li Chiang, Hsinchu (TW); Jer-Fu Wang, Hsinchu (TW); Yi-Tse Hung, Hsinchu (TW); Tzu-Chiang Chen, Hsinchu (TW); Meng-Fan Chang, Hsinchu (TW); Hon-Sum Philip Wong, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 833 days.

(21) Appl. No.: 17/727,420

(22) Filed: Apr. 22, 2022

(65) Prior Publication Data

US 2023/0225132 A1 Jul. 13, 2023

Related U.S. Application Data

(60) Provisional application No. 63/266,704, filed on Jan. 12, 2022.

(51) Int. Cl.
*H10B 51/20* (2023.01)
*H10D 30/01* (2025.01)
(Continued)

(52) U.S. Cl.
CPC ......... *H10B 51/20* (2023.02); *H10D 30/0415* (2025.01); *H10D 30/6713* (2025.01);
(Continued)

(58) Field of Classification Search
CPC ........ H10B 51/20; H10B 53/10; H10B 53/30; H01L 23/5226; H01L 23/5283;
(Continued)

(56) References Cited

U.S. PATENT DOCUMENTS 6,600,173 B2 * 7/2003 Tiwari ................... H10B 10/00
977/936
7,544,992 B2 * 6/2009 Shih .................... H10W 20/494
438/257
(Continued)

FOREIGN PATENT DOCUMENTS

TW I686923 3/2020
TW 202127590 7/2021

*Primary Examiner* — Caleb E Henry
(74) *Attorney, Agent, or Firm* — Hauptman Ham, LLP

(57) ABSTRACT

A memory structure includes a substrate. The memory structure further includes a first transistor, wherein the first transistor is a first distance from the substrate. The memory structure further includes a second transistor, wherein the second transistor is a second distance from the substrate, and the first distance is different from the second distance, and a first source/drain (S/D) region of the first transistor is connected to a second S/D region of the second transistor. The memory structure further includes a plurality of storage elements electrically connected to both the first transistor and the second transistor, wherein each of the plurality of storage elements is a third distance from the substrate, and the third distance is different from both the first distance and the second distance.

20 Claims, 14 Drawing Sheets

(51) Int. Cl.

| | |
|---|---|
| *H10D 30/67* | (2025.01) |
| *H10D 30/69* | (2025.01) |
| *H10W 20/41* | (2026.01) |
| *H10W 20/42* | (2026.01) |

(52) U.S. Cl.
CPC ..... *H10D 30/6735* (2025.01); *H10D 30/6757* (2025.01); *H10D 30/701* (2025.01); *H10W 20/42* (2026.01); *H10W 20/435* (2026.01)

(58) Field of Classification Search
CPC ........... H01L 29/42392; H01L 29/6684; H01L 29/78391; H01L 29/78618; H01L 29/78696; Y02D 10/00
See application file for complete search history.

(56) References Cited

U.S. PATENT DOCUMENTS

| 8,237,228 | B2 * | 8/2012 | Or-Bach | .............. | H10B 10/125 |
| | | | | | 257/369 |
| 8,437,192 | B2 | 5/2013 | Lung et al. | | |

| 8,450,804 | B2 * | 5/2013 | Sekar | .................... | H01L 23/481 |
|---|---|---|---|---|---|
| | | | | | 257/712 |
| 9,035,464 | B2 * | 5/2015 | Li | ...................... | H01L 21/76805 |
| | | | | | 257/774 |
| 9,875,929 | B1 * | 1/2018 | Shukla | .............. | H01L 29/40117 |
| 10,141,221 | B1 * | 11/2018 | Lai | .................... | H01L 21/76831 |
| 10,217,746 | B1 * | 2/2019 | Kim | .................... | H10B 63/845 |
| 10,290,648 | B1 * | 5/2019 | Zhou | ...................... | H10B 43/27 |
| 11,355,381 | B2 * | 6/2022 | Or-Bach | .............. | H10B 20/00 |
| 2003/0020090 | A1 * | 1/2003 | Heck | .................. | H01L 21/8221 |
| | | | | | 257/E21.12 |
| 2011/0143506 | A1 * | 6/2011 | Lee | ...................... | H10B 12/053 |
| | | | | | 438/238 |
| 2016/0365352 | A1 * | 12/2016 | Nishikawa | .......... | H01L 23/5226 |
| 2017/0053906 | A1 * | 2/2017 | Or-Bach | .............. | H10B 12/20 |
| 2017/0162597 | A1 * | 6/2017 | Sharangpani | ..... | H01L 29/40117 |
| 2018/0342557 | A1 * | 11/2018 | Mori | .................... | H10N 70/823 |
| 2020/0051904 | A1 * | 2/2020 | Tang | .................... | H01L 23/528 |
| 2020/0350203 | A1 * | 11/2020 | Fratin | ...................... | G11C 8/08 |
| 2020/0388650 | A1 * | 12/2020 | Nardi | ................. | G11C 13/0026 |
| 2020/0395407 | A1 * | 12/2020 | Takahashi | ............ | H10N 70/066 |
| 2020/0395408 | A1 * | 12/2020 | Takahashi | ............ | H10B 63/845 |
| 2020/0402988 | A1 * | 12/2020 | Howder | ................. | H10B 43/27 |
| 2020/0403033 | A1 * | 12/2020 | Lilak | ...................... | H10B 43/50 |

* cited by examiner

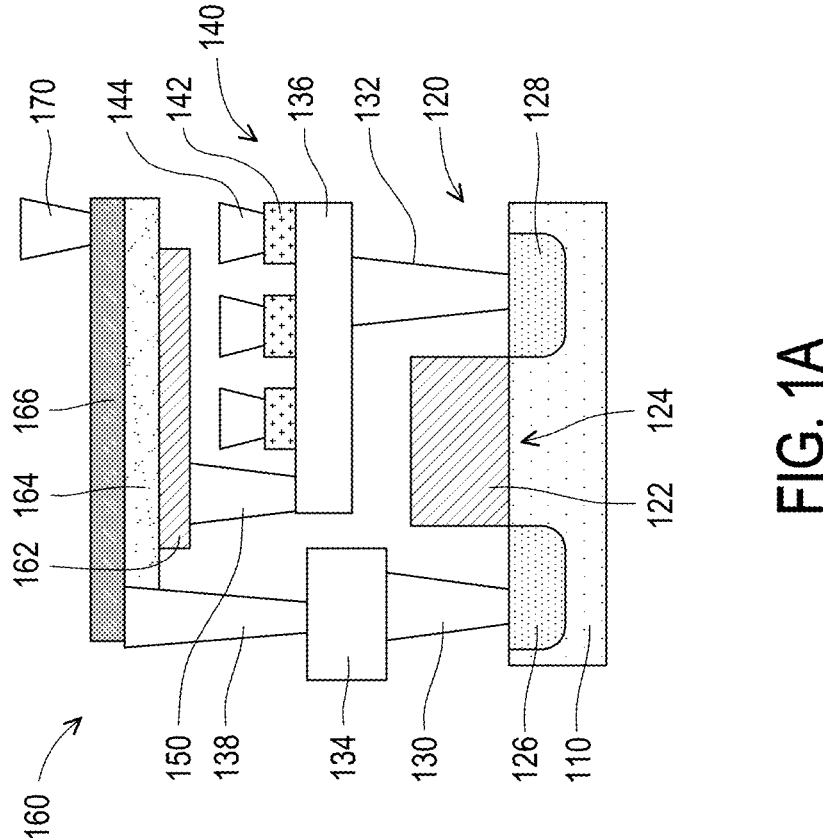
FIG. 1A

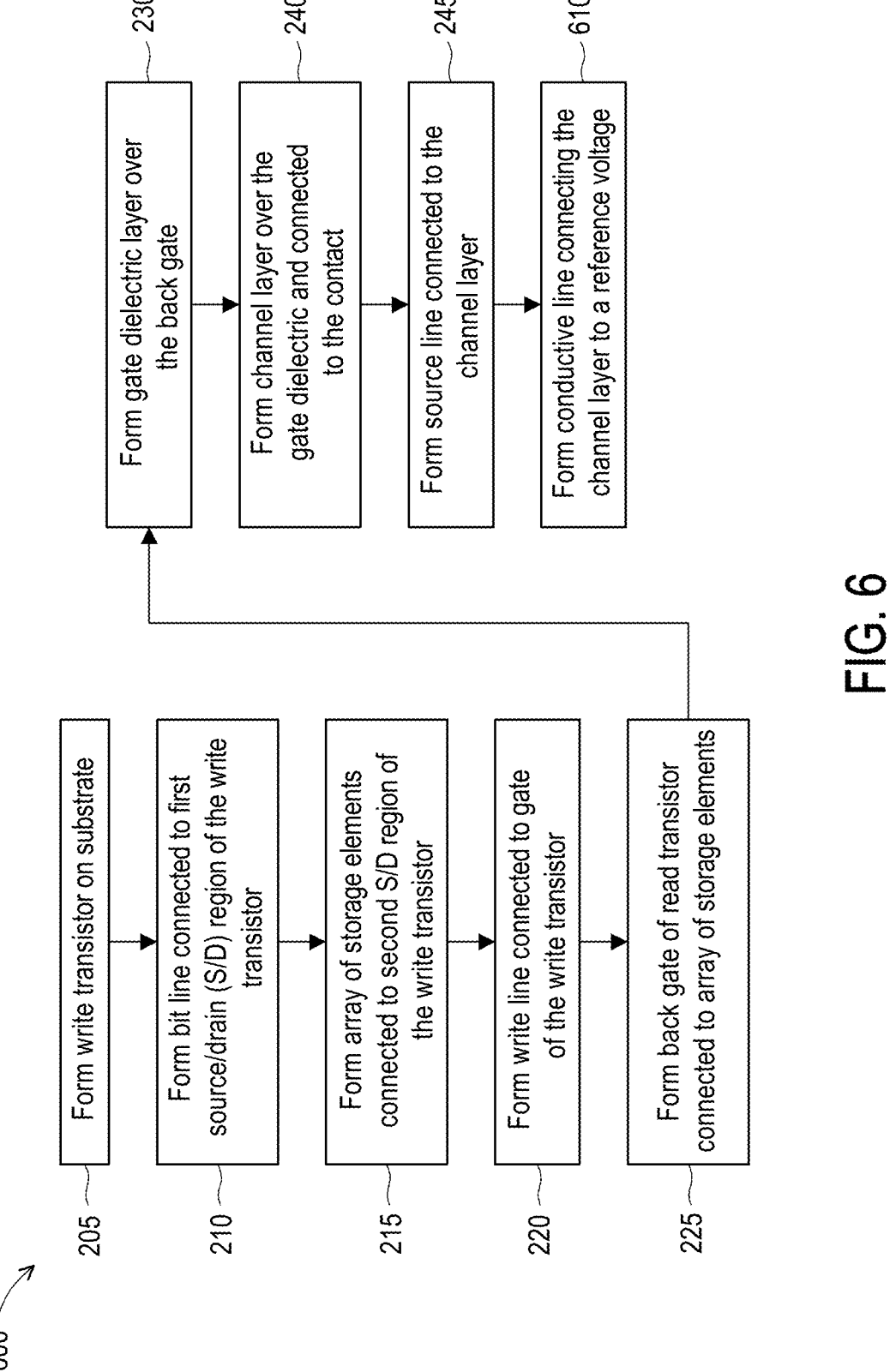

FIG. 6

230 — Form gate dielectric layer over the back gate

240 — Form channel layer over the gate dielectric and connected to the contact

245 — Form source line connected to the channel layer

610 — Form conductive line connecting the channel layer to a reference voltage

205 — Form write transistor on substrate

210 — Form bit line connected to first source/drain (S/D) region of the write transistor 215 — Form array of storage elements connected to second S/D region of the write transistor 220 — Form write line connected to gate of the write transistor 225 — Form back gate of read transistor connected to array of storage elements

600

MEMORY STRUCTURE INCLUDING A PLURALITY OF TRANSISTORS CONNECTED TO A STORAGE ELEMENT

PRIORITY CLAIM AND CROSS-REFERENCE

The current application claims priority to provisional application 63/266,704 filed Jan. 12, 2022, the entire contents of which are incorporated herein by reference in their entirety.

BACKGROUND

Memory structures are used to store data created during execution of a process. In some instances, the data is stored by controlling a charge stored in one or more storage elements. In some instances, the data is stored by controlling a resistance of one of more storage elements. The charge or resistance of the storage elements is controlled using a write transistor or program transistor. The data is read out of the one or more storage elements using a read transistor. Memory structures in other approaches form each of the read transistor and the write transistor directly on a substrate of the memory structure. The size of these transistors on the substrate is a determinative factor in an overall size of the memory structure and a device that includes the memory structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a cross-sectional view of a memory structure, in accordance with some embodiments.

FIG. 6 is a flowchart of a method of making a memory structure, in accordance with some embodiments.

DETAILED DESCRIPTION

Figure 1B:
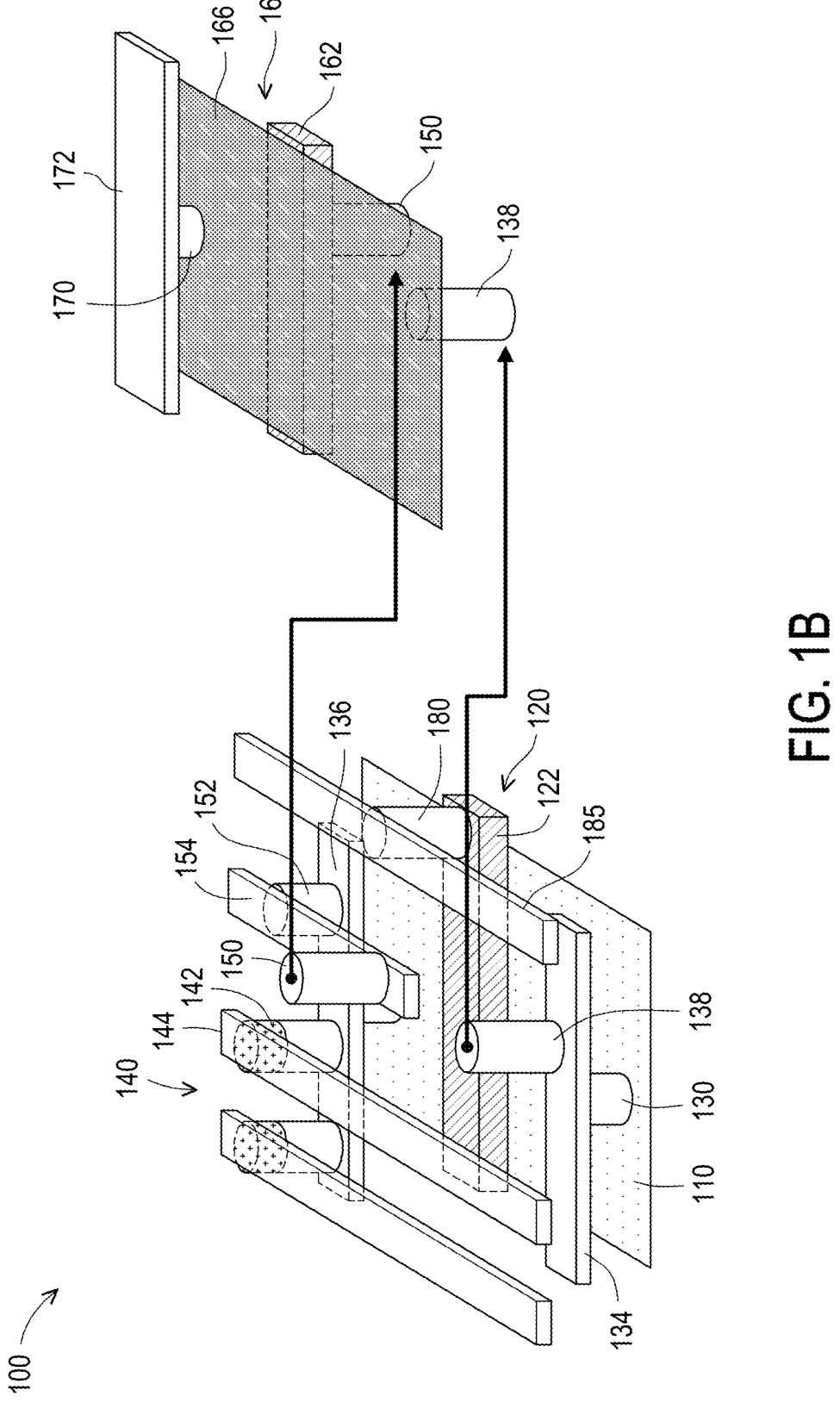
FIG. 1B is a perspective view of a memory structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As devices including semiconductor elements decrease in size, development of smaller semiconductor components, such as memory structures, having reduced size helps to facilitate the size decrease. In some approaches, memory structures that include two transistors and n-number of storage elements, called 2TnC memory structures, both of the transistors are formed directly on a substrate of the memory structure. Forming both of the transistors directly on the substrate minimizes an ability to reduce a size of the memory structure.

In order to help facilitate device size reduction, formation of one of the transistors vertically offset from the other transistor of the memory structure reduces an amount of space on the substrate occupied by a memory structure. In some embodiments, one of the transistors is formed within an interconnect structure and the other transistor is formed in contact with the substrate. In some embodiments, a read transistor is formed as part of the interconnect structure in order to help reduce a size of the memory structure; while a write transistor is formed directly on the substrate in order to help maintain sufficient write current to precisely control the storage elements in the memory structure. The vertical stacking of the transistors reduces a footprint of the memory structure in comparison with approaches that form both transistors on a same surface of the substrate.

FIG. 1A is a cross-sectional view of a memory structure 100, in accordance with some embodiments. In some embodiments, the memory structure 100 is part of a larger device, such as a memory array. In some embodiments, the memory array is usable in a computing device, such as a mobile terminal, a server, a computer, or the like. The memory structure 100 includes a substrate 110. A first transistor 120 is in contact with the substrate 110. A contact 130 is electrically connected to a first source/drain (S/D) region 126 of the first transistor 120. A contact 132 is electrically connected to a second S/D region 128 of the first transistor 120. A conductive line 134 is electrically connected to the contact 130. A conductive line 136 is electrically connected to the contact 132. A via 138 is electrically connected to the conductive line 134 on an opposite side of the conductive line 134 from the contact 130. A plurality of storage elements 140 are electrically connected to the conductive line 136. Each of the plurality of storage elements 140 includes a storage structure 142 and a conductive line 144 electrically connected to the storage structure 142 on an opposite side of the storage structure 142 from the conductive line 136. A via 150 is electrically connected to the conductive line 136. A second transistor 160 is over the first transistor 120 and electrically connected to the via 138 and the via 150. The via 150 is electrically connected to a gate 162 of the second transistor 160. The via 138 is electrically connected to a first S/D region electrically connected to a channel layer 166 of the second transistor 160. A via 170 is electrically connected to a second S/D region electrically connected to the channel layer 166 of the second transistor 160. A contact to a gate 122 of the first transistor 120 is not visible in the cross-sectional view of FIG. 1A; however, the contact is visible in the perspective view of FIG. 1B.

While not explicitly shown in FIG. 1A, one of ordinary skill in the art would understand that the structures above the substrate 110 are surrounded by one or more dielectric materials. The dielectric materials include, for example, inter-layer dielectric (ILD) layer, etch stop layers (ESLs), inter-metallic dielectric (IMD) layers, or the like. In some embodiments, the dielectric materials include low-k dielectric materials. In some embodiments, the ILD layer and the IMD layers include a same material. In some embodiments, the ILD layer and the IMD layers include different materials. The ESLs have a different etch selectivity from each of the ILD layer and the IMD layers.

The substrate 110 supports the components of the memory structure 100. In some embodiments, substrate 110 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 110 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

The first transistor 120 is on the substrate 110. In some embodiments, the first transistor 120 is functional as a write transistor or program transistor for the memory structure 100. In some embodiments, the first transistor 120 is in direct contact with the substrate 110. In some embodiments, the first transistor 120 has a metal-oxide-semiconductor field effect transistor (MOSFET) structure. In some embodiments, the first transistor 120 has a fin field effect transistor (FinFET) structure. In some embodiments, the first transistor 120 has a gate all around (GAA) structure.

The first transistor 120 includes a gate structure 122 configured to control a conductivity of a channel region 124 of the first transistor 120. The channel region 124 is usable to selectively electrically connect the first S/D region 126 to the second S/D region 128. In some embodiments, the first transistor 120 further includes additional components, such as lightly doped drain (LDD) regions, S/D extensions, or other suitable components.

The gate structure 122 is on the substrate 110. The gate structure 122 includes a gate dielectric layer and a gate electrode. In some embodiments, the gate structure 122 includes additional components, such as an interfacial layer, a work function layer, or other suitable components. The gate dielectric layer provides electrical separation between the gate electrode and the channel region 124. In some embodiments, gate dielectric layer includes silicon dioxide, silicon nitride, silicon oxynitride or another suitable dielectric material. In some embodiments, gate dielectric layer includes a high-k dielectric material. A high-k dielectric material has a dielectric constant (k) higher than the dielectric constant of silicon dioxide. In some embodiments, k is greater than 3.9. In some embodiments, k is greater than 8.0. The gate electrode includes a conductive material to receive a signal for controlling the conductivity of the channel region 124. In some embodiments, the gate electrode includes copper, cobalt, tungsten, aluminum, alloys thereof, or other suitable conductive materials. In FIG. 1A, the gate structure 122 is on top of the substrate 110. In some embodiments, the gate structure 122 surrounds a portion of the substrate 110, such as in a FinFET structure.

The channel region 124 is usable to selectively electrically connect the first S/D region 126 to the second S/D region 128. In some embodiments, the channel region 124 defines a two-dimensional (2D) channel. In some embodiments, the channel region 124 defines a three-dimensional (3D) channel. In some embodiments, a dopant concentration in the channel region 124 is higher than a dopant concentration in a bulk of the substrate 110. In some embodiments, the channel region 124 includes a strained channel. In some embodiments, the channel region 124 is within the substrate 110. In some embodiments, the channel region 124 is separated from the substrate 110, such as in a GAA structure. In some embodiments, the channel region 124 has a dopant type that is a same dopant type as the bulk of the substrate 110. In some embodiments, the channel region 124 has a dopant type opposite to the dopant type of the bulk of the substrate 110.

The first S/D region 126 is configured to selectively electrically connect the second S/D region 128 to the contact 130 based on a conductivity of the channel region 124, which is controlled by a signal applied to the gate structure 122. In some embodiments, the first S/D region 126 includes a doped region within the substrate 110. In some embodiments, a dopant concentration of the first S/D region 126 is higher than the dopant concentration of the channel region 124. In some embodiments, the first S/D region 126 has an opposite dopant type from the channel region 124. In some embodiments, the first S/D region 126 has a same dopant type as the channel region 124. In some embodiments, the first S/D region 126 includes a strained S/D. In some embodiments, a top surface of the first S/D region 126 is coplanar with a top surface of the substrate 110. In some embodiments, the top surface of the first S/D region 126 protrudes above the top surface of the substrate 110. In some embodiments, the first S/D region 126 includes silicon germanium (SiGe). In some embodiments, the first S/D region 126 is formed by ion implantation. In some embodiments, the first S/D region 126 is formed by epitaxially growth.

The second S/D region 128 is configured to selectively electrically connect the first S/D region 126 to the contact 132 based on the conductivity of the channel region 124, which is controlled by the signal applied to the gate structure 122. A structure of the second S/D region 128 is similar to a structure of the first S/D region 126, which is not repeated here for the sake of brevity.

The contact 130 is configured to electrically connect the first S/D region 126 to the conductive line 134. In some embodiments, a silicide layer electrically connects the first S/D region 126 to the contact 130. In some embodiments, the contact 130 includes copper, cobalt, aluminum, tungsten, alloys thereof, or other suitable conductive materials. In some embodiments, the contact 130 has a tapered profile. In some embodiments, the contact 130 has parallel sidewalls. In some embodiments, the contact 130 extends only through an ILD layer. In some embodiments, the contact 130 extends through the ILD layer as well as at least one IMD layer.

The contact 132 is configured to electrically connect the second S/D region 128 to the conductive line 136. In some embodiments, a silicide layer electrically connects the second S/D region 128 to the contact 132. In some embodiments, the contact 132 includes copper, cobalt, aluminum, tungsten, alloys thereof, or other suitable conductive materials. In some embodiments, the contact 132 includes a same material as the contact 130. In some embodiments, the contact 132 includes a different material from the contact 130. In some embodiments, the contact 132 has a tapered profile. In some embodiments, the contact 132 has parallel sidewalls. In some embodiments, the contact 132 has a same profile as the contact 130. In some embodiments, the contact 132 has a different profile from the contact 130. In some embodiments, the contact 132 extends only through an ILD layer. In some embodiments, the contact 130 extends through the ILD layer as well as at least one IMD layer. In some embodiments, the contact 132 has a same length, perpendicular to a top surface of the substrate, as the contact 130. In some embodiments, the contact 132 has a different length from the contact 130.

The conductive line 134 is configured to electrically connect the contact 130 to the via 138. In some embodiments, the conductive line 134 is also configured to function as a bit line (BL) for the memory structure 100. In some embodiments, the conductive line 134 includes copper, cobalt, aluminum, tungsten, alloys thereof, or other suitable conductive materials. In some embodiments, the conductive line 134 includes a same material as the contact 130 and the contact 132. In some embodiments, the conductive line 134 includes a different material from at least one of the contact 130 or the contact 132.

The conductive line 136 is configured to electrically connect the contact 132 to the plurality of storage elements 140 and to the via 150. In some embodiments, the conductive line 136 is a same distance from the top surface of the substrate 110 as the conductive line 134. In some embodiments, the conductive line 136 is a different distance from the substrate 110 from the conductive line 134. In some embodiments, the conductive line 136 includes copper, cobalt, aluminum, tungsten, alloys thereof, or other suitable conductive materials. In some embodiments, the conductive line 136 includes a same material as the contact 130, the contact 132 and the conductive line 134. In some embodiments, the conductive line 136 includes a different material from at least one of the contact 130, the contact 132, or the conductive line 134.

The via 138 is configured to electrically connect the conductive line 134 to a first S/D region of the channel layer 166. In some embodiments, the via 138 extends through a single IMD layer. In some embodiments, the via 138 extends through more than one IMD layer. In some embodiments, the via 138 includes copper, cobalt, aluminum, tungsten, alloys thereof, or other suitable conductive materials. In some embodiments, the via 138 includes a same material as the contact 130, the contact 132, the conductive line 134, and the conductive line 136. In some embodiments, the via 138 includes a different material from at least one of the contact 130, the contact 132, the conductive line 134, or the conductive line 136.

The memory structure 100 includes three storage elements 140. Therefore, in some embodiments, the memory structure 100 would be called a 2T3C memory structure. However, one of ordinary skill in the art would understand that the number of storage elements 140 is merely an example and that memory structures including more or less than three storage elements 140 are within the scope of this disclosure. Each storage element 140 includes a storage structure 142 and a conductive line 144. The storage structure 142 is between the conductive line 136 and a corresponding conductive line 144.

Figures 7A, 7B, 7C:
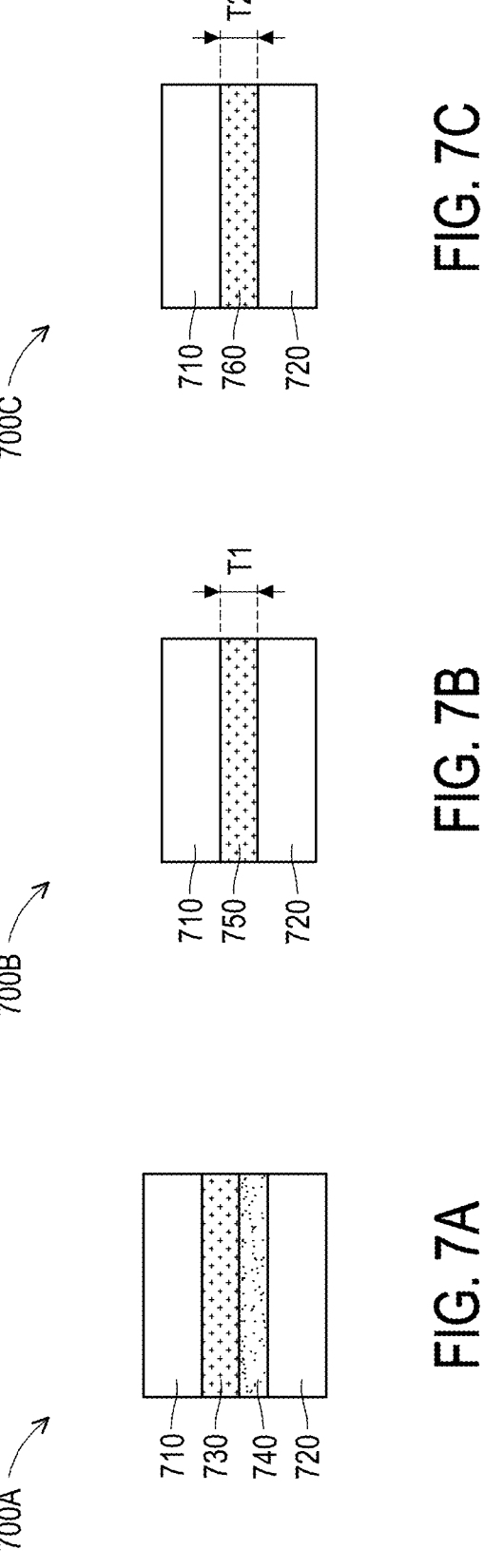
FIGS. 7A-7C are cross-sectional views of storage elements, in accordance with some embodiments.

The storage structure 142 is configured to change either a stored charge or a resistance based on signals along the conductive line 136 and the corresponding conductive line 144. In some embodiments, the storage structure 142 includes a ferroelectric material between two conductive materials. In some embodiments, the ferroelectric material includes potassium dihydrogen phosphate, barium titanate or other suitable ferroelectric materials. In some embodiments, the storage structure 142 has a structure corresponding to the storage structure 700A (FIG. 7A). In some embodiments, the storage structure 142 has a structure corresponding to the storage structure 700B (FIG. 7B). In some embodiments, the storage structure 142 has a structure corresponding to the storage structure 700C (FIG. 7C).

The conductive line 144 is configured to electrically connect the one side of the corresponding storage structure 142 to a reference voltage. In some embodiments, the conductive line 144 is configured to function as a programming line (PL) for the memory structure 100. In some embodiments, the reference voltage is a ground voltage, e.g., VSS. In some embodiments, the conductive line 144 includes copper, cobalt, aluminum, tungsten, alloys thereof, or other suitable conductive materials. In some embodiments, the conductive line 144 includes a same material as the contact 130, the contact 132, the conductive line 134, the conductive line 136, and the via 138. In some embodiments, the conductive line 144 includes a different material from at least one of the contact 130, the contact 132, the conductive line 134, the conductive line 136, or the via 138.

The via 150 is configured to electrically connect the conductive line 136 to the gate 162. In some embodiments, the via 150 extends through a single IMD layer. In some embodiments, the via 150 extends through more than one IMD layer. In some embodiments, the via 150 includes copper, cobalt, aluminum, tungsten, alloys thereof, or other suitable conductive materials. In some embodiments, the via 150 includes a same material as the contact 130, the contact 132, the conductive line 134, the conductive line 136, the via 138, and the conductive line 144. In some embodiments, the via 150 includes a different material from at least one of the contact 130, the contact 132, the conductive line 134, the conductive line 136, the via 138, or the conductive line 144.

The second transistor 160 is configured to selectively electrically connect the via 138 to the via 170. In some embodiments, the second transistor 160 is configured to function as a read transistor for the memory structure 100. In some embodiments, the second transistor 160 has a MOSFET structure. In some embodiments, the second transistor 160 has a thin film transistor (TFT) structure. The second transistor 160 includes the gate 162, a gate dielectric layer 164 and a channel layer 166. The gate dielectric layer is between the gate 162 and the channel layer 166.

The gate 162 includes a conductive material configured to receive a signal from the via 150. In some embodiments, the gate 162 is called a back gate because the gate 162 is between the channel layer 166 and the substrate 110. In some embodiments, the gate 162 includes additional components, such as a work function layer. In some embodiments, the gate 162 includes copper, cobalt, tungsten, aluminum, alloys thereof, or other suitable conductive materials. In some embodiments, the gate 162 includes a same material as the gate electrode of the gate structure 122. In some embodiments, the gate 162 includes a different material from the gate electrode of the gate structure 122. In some embodiments, the gate 162 includes a same material as the contact 130, the contact 132, the conductive line 134, the conductive line 136, the via 138, the conductive line 144, and the via 150. In some embodiments, the gate 162 includes a different material from at least one of the contact 130, the contact 132, the conductive line 134, the conductive line 136, the via 138, the conductive line 144, or the via 150.

The gate dielectric 164 provides electrical separation between the gate 162 and the channel layer 166. In some embodiments, gate dielectric 164 includes silicon dioxide, silicon nitride, silicon oxynitride or another suitable dielectric material. In some embodiments, the gate dielectric 164 includes a high-k dielectric material. In some embodiments, k is greater than 3.9. In some embodiments, k is greater than 8.0. In some embodiments, the gate dielectric 164 includes a same material as the gate dielectric layer of the gate structure 122. In some embodiments, the gate dielectric 164 includes a different material from the gate dielectric layer of the gate structure 122. In some embodiments, the gate dielectric 164 includes additional components, such as an interfacial layer.

The channel layer 166 is configured to provide selective electrical connection between the via 138 and the via 170 based on a signal received by the gate 162. In some embodiments, the channel layer 166 includes a doped semiconductor material. In some embodiments, the semiconductor material includes silicon. In some embodiments, the dopants are introduced into the semiconductor material using an implantation process. In some embodiments, the dopants are introduced into the semiconductor material using an in-situ doping process.

The channel layer 166 includes a first S/D region electrically connected to the via 138. The channel layer 166 further includes a second S/D region electrically connected to the via 170. In some embodiments, a channel region of the channel layer 166 between the first S/D region and the second S/D region has a lower dopant concentration than either of the first S/D region or the second S/D region. In some embodiments, a dopant type of the first S/D region and the second S/D region of the channel layer 166 is different from a dopant type of the channel region of the channel layer 166. In some embodiments, a dopant type of the first S/D region and the second S/D region of the channel layer 166 is a same dopant type as the channel region of the channel layer 166. In some embodiments, at least one of the first S/D region or the second S/D region includes a strained S/D structure, e.g., including SiGe.

The via 170 is configured to electrically connect the second S/D region to a conductive line (not shown). In some embodiments, the via 170 lands on a top surface of the second S/D region. In some embodiments, the via 170 partially penetrates into the second S/D region. In some embodiments, the conductive line connected to the via 170 is configured to function as a source line (SL) for providing a fixed voltage during a read operation of the memory structure 100. In some embodiments, the via 170 includes copper, cobalt, aluminum, tungsten, alloys thereof, or other suitable conductive materials. In some embodiments, the via 170 includes a same material as the contact 130, the contact 132, the conductive line 134, the conductive line 136, the via 138, the conductive line 144, and the via 150. In some embodiments, the via 170 includes a different material from at least one of the contact 130, the contact 132, the conductive line 134, the conductive line 136, the via 138, the conductive line 144, or the via 150.

By using the three-dimensional stacking structure of the first transistor 120 and the second transistor 160, the memory structure 100 has a reduced size on the substrate 110 in comparison with other approaches that include both the transistors directly on the substrate. In some embodiments, positioning the second transistor 160 as the read transistor as being separated from the substrate helps to reduce the size of the memory structure 100 while continuing to provide sufficient write current through the first transistor 120 to precisely control the plurality of storage elements 140. This arrangement helps to ensure that data is reliably recorded on the memory structure 100. The reduced sized for the memory structure 100 helps to facilitate reduction is size of a memory array usable in other devices. The reduced size of the memory array helps to either provide additional memory storage capabilities in a same space or to provide additional functionality from other components for the overall device.

FIG. 1B is a perspective view of the memory structure 100, in accordance with some embodiments. The memory structure 100 is shown in two pieces for ease of understanding. One of ordinary skill in the art would understand that the actual structure would be a unified structure. The lines in FIG. 1B extending between vias 138 and between vias 156 are merely to show how the two pieces of FIG. 1B are aligned with one another. One of ordinary skill in the art would understand that these lines are not physical components of the memory structure 100. Components of the memory structure 100 that are visible in FIG. 1A have the same reference number and are not described with reference to FIG. 1B for the sake of brevity. In addition to the components visible in FIG. 1A, the view of the memory structure 100 in FIG. 1B further includes a conductive line 172, a via 180 and a conductive line 185. The gate dielectric layer 164 visible in FIG. 1A is excluded from FIG. 1B for clarity purposes.

The conductive line 172 is configured to receive a signal to be applied to the second S/D region of the channel layer 166. In some embodiments, the conductive line 172 is configured to function as a source line (SL) for the memory structure 100. In some embodiments, the conductive line 172 includes copper, cobalt, aluminum, tungsten, alloys thereof, or other suitable conductive materials. In some embodiments, the conductive line 172 includes a same material as the contact 130, the contact 132, the conductive line 134, the conductive line 136, the via 138, the conductive line 144, the via 150, and the via 170. In some embodiments, the conductive line 172 includes a different material from at least one of the contact 130, the contact 132, the conductive line 134, the conductive line 136, the via 138, the conductive line 144, the via 150, or the via 170.

The via 180 is configured to electrically connect the gate structure 122 to the conductive line 185. In some embodiments, the via 180 includes copper, cobalt, aluminum, tungsten, alloys thereof, or other suitable conductive materials. In some embodiments, the via 180 includes a same material as the contact 130, the contact 132, the conductive line 134, the conductive line 136, the via 138, the conductive line 144, the via 150, the via 170, and the conductive line 172. In some embodiments, the via 180 includes a different material from at least one of the contact 130, the contact 132, the conductive line 134, the conductive line 136, the via 138, the conductive line 144, the via 150, the via 170, or the conductive line 172.

The conductive line 185 is configured to receive a signal for controlling the first transistor 120. In some embodiments, the conductive line 185 is configured to function as a write line (WL) for the memory structure 100. In some embodiments, the conductive line 185 includes copper, cobalt, aluminum, tungsten, alloys thereof, or other suitable conductive materials. In some embodiments, the conductive line 185 includes a same material as the contact 130, the contact 132, the conductive line 134, the conductive line 136, the via 138, the conductive line 144, the via 150, the via 170, the conductive line 172, and the via 180. In some embodiments, the conductive line 185 includes a different material from at least one of the contact 130, the contact 132, the conductive line 134, the conductive line 136, the via 138, the conductive line 144, the via 150, the via 170, the conductive line 172, or the via 180.

Figure 2:
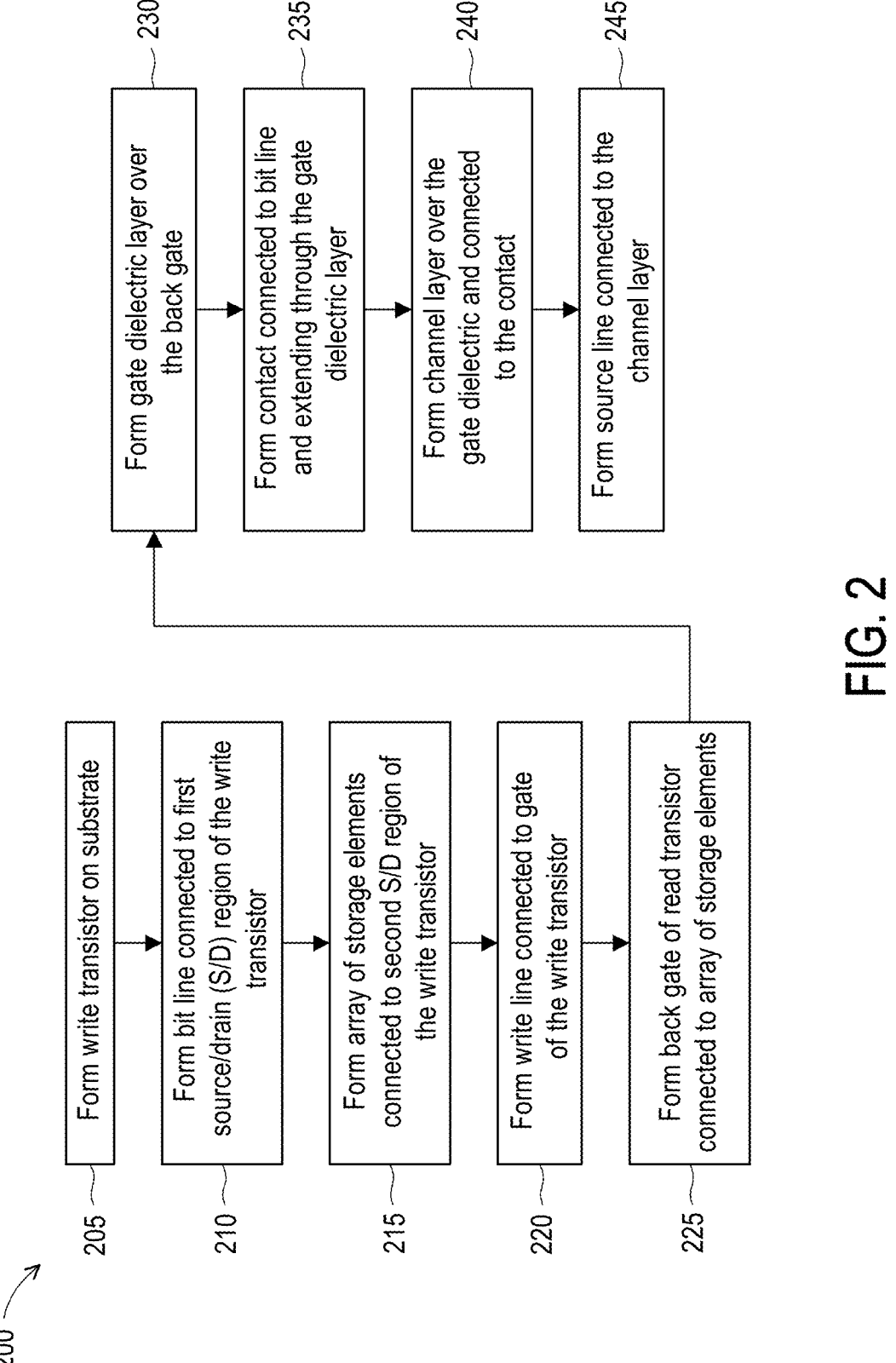
FIG. 2 is a flowchart of a method of making a memory structure, in accordance with some embodiments.

FIG. 2 is a flowchart of a method 200 of making a memory structure, in accordance with some embodiments. In some embodiments, the method 200 is usable to manufacture the memory structure 100 (FIG. 1A). In some embodiments, the method 200 is usable to manufacture a memory structure different from the memory structure 100 (FIG. 1A).

In operation 205, a write transistor is formed on a substrate. In some embodiments, the write transistor is formed by doping a portion of the substrate to define an active area for a channel of the write transistor. In some embodiments, the doping is performed using an implantation process. In some embodiments, the doping is performed in-situ with the formation of a semiconductor layer of the substrate. In some embodiments, the doping is performed by depositing a layer of dopants and driving the dopants into the substrate using a thermal process, such as annealing.

In some embodiments, the write transistor is formed by forming S/D regions in the substrate adjacent to the channel. In some embodiments, the S/D regions are formed using an implantation process. In some embodiments, the S/D regions are formed by etching openings in the substrate and epitaxially growing the S/D regions in the openings.

In some embodiments, the write transistor is formed by forming gate structure over the channel and between the S/D regions. In some embodiments, the gate structure is formed prior to forming the S/D regions. In some embodiments, the gate structure is formed after forming the S/D regions. In some embodiments, the gate structure is formed using a replacement gate process. In some embodiments, the gate structure is formed by depositing a gate dielectric layer over the substrate and depositing a gate electrode over the gate dielectric layer.

In some embodiments, the formation of the write transistor includes additional operations, such as formation of spacers, including additional layers in the gate structure, forming silicide layers on the S/D regions, etching of the substrate to define a fin, or other suitable operations. In some embodiments, forming the write transistor includes forming a MOSFET transistor. In some embodiments, forming the write transistor includes forming a FinFET transistor. In some embodiments, forming the write transistor includes forming a GAA transistor.

In some embodiments, the operation 205 further includes forming of contacts electrically connected to the S/D regions. In some embodiments, the contacts are formed by depositing an ILD layer over the S/D regions, etching the ILD layer to define openings in the ILD layer exposing a portion of each of the S/D regions, and depositing the contacts in the openings.

FIGS. 3A-3I are perspective views of a memory structure at different stages of manufacture, in accordance with some embodiments. In some embodiments, the memory structures of FIGS. 3A-3I correspond to the memory structure following an operation described with respect to the method 200 (FIG. 2). Elements in FIGS. 3A-3I that are similar to elements in the memory structure 100 (FIG. 1A) have the same reference numbers for the sake of simplicity and ease of understanding. One of ordinary skill in the art would understand that the intermediate structures of FIGS. 3A-3I are not limited to only the operations descried with respect to the method 200 (FIG. 2) or the memory structure 100 (FIG. 1A). Some elements are not labeled in less than all of the FIGS. 3A-3I for the sake of clarity and brevity.

Figures 3A, 3B:
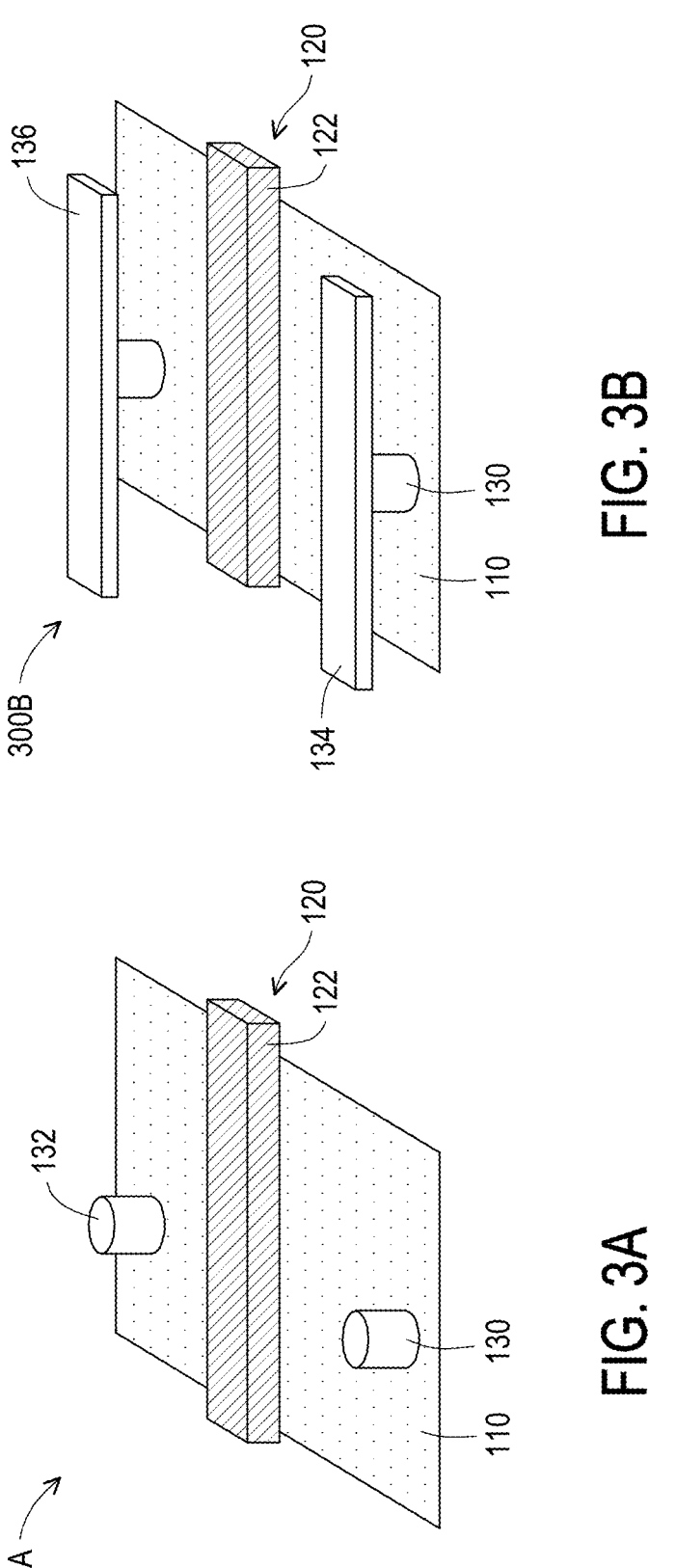
FIGS. 3A-3I are perspective views of a memory structure during various stages of manufacture, in accordance with some embodiments.

FIG. 3A is a perspective view of a memory structure 300A at an intermediate stage of manufacture, in accordance with some embodiments. In some embodiments, the memory structure 300A is a perspective view following operation 205 of the method 200 (FIG. 2). The memory structure 300A includes the gate structure 122 over the substrate 110. The memory structure 300A further includes the contact 130 electrically connected the first S/D region (not labeled) of the first transistor 120. The memory structure 300A further includes the contact 132 electrically connected to the second S/D region (not labeled) of the first transistor 120.

Returning to FIG. 2, in operation 210, a bit line is formed connected to the first S/D region of the write transistor. The bit line is formed as a conductive line in an interconnect structure attached to the write transistor. In some embodiments, the bit line is formed using an etching process to define an opening in a dielectric layer, such as an IMD layer, of the interconnect structure. The opening is then filled with a conductive material to define the bit line. In some embodiments, the bit line is formed using a dual damascene process.

In some embodiments, in operation 210, a second conductive line is formed electrically connected to the second S/D region of the write transistor. In some embodiments, the second conductive line is formed simultaneously with the bit line. In some embodiments, the second conductive line is formed before or after the formation f the bit line. In some embodiments, the second conductive line is formed using an etching process to define an opening in a dielectric layer, such as an IMD layer, of the interconnect structure. The opening is then filled with a conductive material to define the second conductive line. In some embodiments, the second conductive line is formed using a dual damascene process. In some embodiments, the second conductive line is a same distance from the substrate as the bit line. In some embodiments, the second conductive line is a different distance from the substrate than the bit line.

FIG. 3B is a perspective view of a memory structure 300B at an intermediate stage of manufacture, in accordance with some embodiments. In some embodiments, the memory structure 300B is a perspective view following operation 210 of the method 200 (FIG. 2). In comparison with the memory structure 300A (FIG. 3A), the memory structure 300B includes a first conductive line 134 electrically connected to the contact 130 (labeled in FIG. 3A). The first conductive line 134 is capable of functioning as a bit line. The memory structure 300B further includes a second conductive line 136 electrically connected to the contact 132 (labeled in FIG. 3A).

Returning to FIG. 2, in operation 215, an array of storage elements is formed connected to the second S/D region of the write transistor. Forming the array of storage elements includes forming a stack of layers and then etching the layers to define the storage elements. In some embodiments, forming the stack of layers includes depositing a bottom conductive layer, depositing a ferroelectric layer over the bottom conductive layer, and depositing a top conductive layer over the ferroelectric layer. In some embodiments, forming the stack of layers includes depositing an oxide layer over the bottom conductive layer prior to depositing the ferroelectric layer. In some embodiments, each of the storage elements includes a structure similar to one of storage elements 700A-700C (FIGS. 7A-7C).

In some embodiments, depositing the bottom conductive layer includes a plating process, a physical vapor deposition (PVD) process, a chemical vapor deposition (CVD) process, or another suitable process. In some embodiments, the bottom conductive layer includes copper, aluminum, tungsten, cobalt, alloys thereof or other suitable conductive materials.

In some embodiments, forming the oxide layer includes a CVD process or another suitable process. In some embodiments, the CVD process is combined with a thermal oxidation process. In some embodiments, the oxide layer includes silicon oxide. In some embodiments, the oxide layer includes a different material, such as silicon oxynitride.

In some embodiments, forming the ferroelectric layer includes a CVD process or another suitable process. In some embodiments, the ferroelectric layer includes potassium dihydrogen phosphate, barium titanate or other suitable ferroelectric materials. In some embodiments, the ferroelectric layer has a thickness of less than 5 nanometers (nm). In some embodiments, the ferroelectric layer has a thickness ranging from about 5 nm to about 15 nm. A ferroelectric layer thickness less than 5 nm is usable to form a ferroelectric tunneling junction (FTJ) that is usable to determine stored data based on resistance across the storage element. A ferroelectric layer thickness ranging from about 5 nm to about 15 nm is usable to form a ferro random access memory (FeRAM) that is usable to determine stored data based on a capacitance of the storage element. In some embodiments, if the thickness of the ferroelectric layer is too great, write time for adjusting a capacitance within the FeRAM increases, in some instances.

In some embodiments, depositing the top conductive layer includes a plating process, a PVD process, a CVD process, or another suitable process. In some embodiments, the top conductive layer includes copper, aluminum, tungsten, cobalt, alloys thereof or other suitable conductive materials. In some embodiments, the top conductive layer includes a same material as the bottom conductive layer. In some embodiments, the top conductive layer includes a different material from the bottom conductive layer. In some embodiments, the top conductive layer is formed using a same process as the bottom conductive layer. In some embodiments, the top conductive layer is formed using a different process from forming the bottom conductive layer.

In some embodiments, the etching process includes a single etching process that removes portions of the stack of layers to define the storage elements. In some embodiments, the etching process includes multiple etching processes. One of ordinary skill in the art would understand that etching conditions are adjustable in order to define the storage elements while minimizing unnecessary damage to exposed components of the storage element during the etching processes.

Figures 3C, 3D:
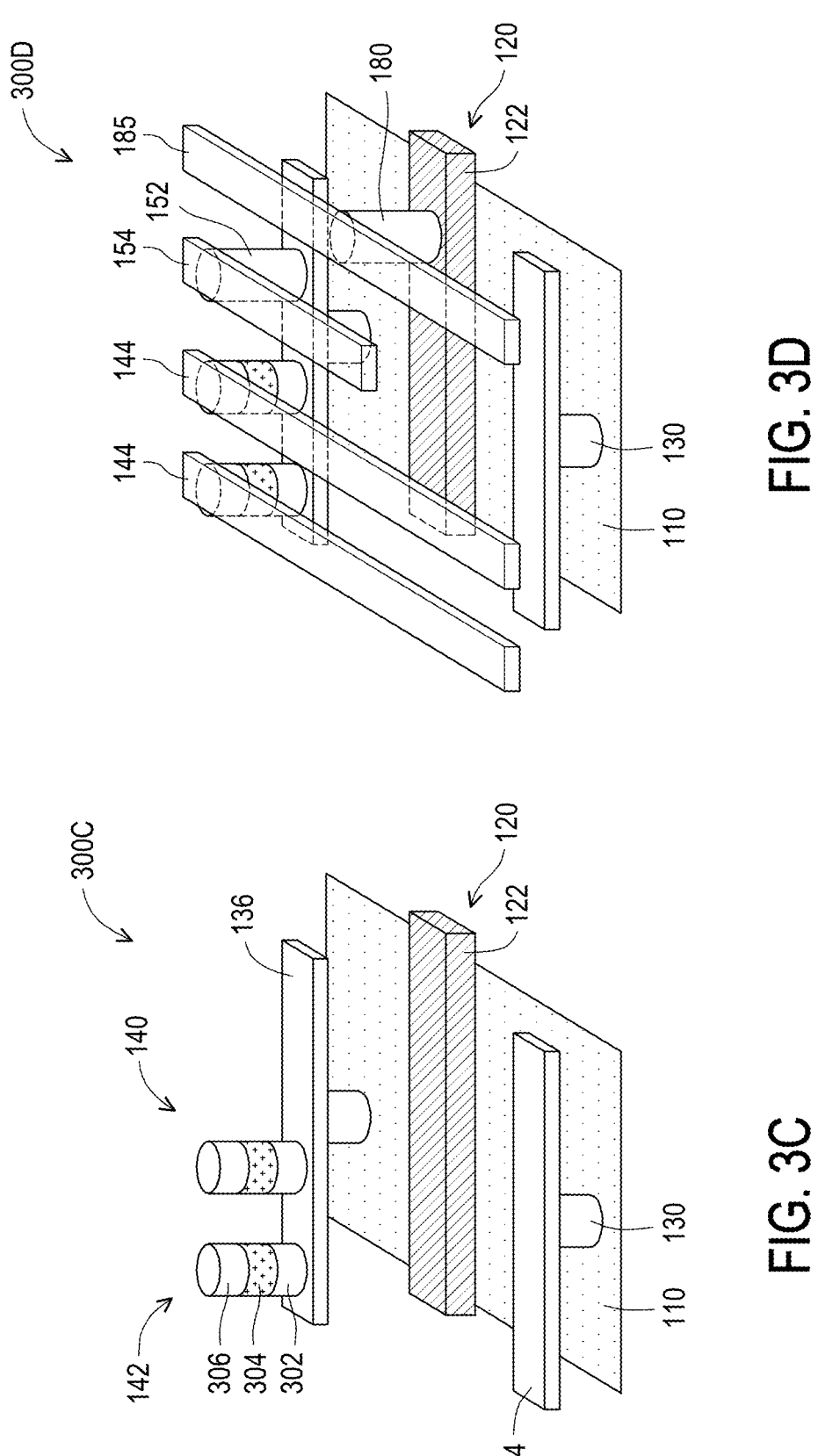

FIG. 3C is a perspective view of a memory structure 300C at an intermediate stage of manufacture, in accordance with some embodiments. In some embodiments, the memory structure 300C is a perspective view following operation 215 of the method 200 (FIG. 2). In comparison with the memory structure 300B (FIG. 3B), the memory structure 300C includes an array of storage elements 142 electrically connected to the second conductive line (labeled in FIG. 3B). Each of the storage elements 142 includes a bottom conductive layer 302, a ferroelectric layer 304 over the bottom conductive layer 302, and a top conductive layer 306 over the ferroelectric layer 304. In some embodiments, the storage elements 142 further includes an oxide layer between the bottom conductive layer 302 and the ferroelectric layer 304. In some embodiments, a thickness of the ferroelectric layer 304 is less than 5 nm. In some embodiments, a thickness of the ferroelectric layer 304 ranges from about 5 nm to about 15 nm. The memory structure 300C includes the storage elements 142 in a one-dimensional array. In some embodiments, the storage elements 142 are in a two-dimensional array or a three-dimensional array. While the above description of the memory structure 300C relates to ferroelectric (FE) random-access memory (FRAM, F-RAM, or FeRAM), one of ordinary skill in the art would understand that this description is also application to other types of memory structures. For example, in some embodiments, the memory structure 300C includes resistive random access memory (RRAM or ReRAM), magneto resistive random access memory (MMRAM), phase change memory (PCM), or another suitable memory structure.

Returning to FIG. 2, in operation 220, a write line is formed connected to the gate structure of the write transistor. The write line is formed as a conductive line in an interconnect structure attached to the write transistor. In some embodiments, the write line is formed using an etching process to define an opening in a dielectric layer, such as an IMD layer, of the interconnect structure. The opening is then filled with a conductive material to define the write line. In some embodiments, the write line is formed using a dual damascene process.

In some embodiments, in operation 220, a plurality of program lines is formed and each of the plurality of program lines is electrically connected to a corresponding storage element of the array of storage elements. In some embodiments, the plurality of program lines is formed simultaneously with the write line. In some embodiments, the plurality of program lines is formed before or after the formation of the write line. In some embodiments, the plurality of program lines is formed using an etching process to define an opening in a dielectric layer, such as an IMD layer, of the interconnect structure. The opening is then filled with a conductive material to define the plurality of program lines. In some embodiments, the plurality of program lines is formed using a dual damascene process. In some embodiments, the plurality of program lines is a same distance from the substrate as the write line. In some embodiments, the plurality of program lines is a different distance from the substrate than the write line. In some embodiments, at least one of the plurality of program lines is a different distance from the substrate than another of the plurality of program lines.

FIG. 3D is a perspective view of a memory structure 300D at an intermediate stage of manufacture, in accordance with some embodiments. In some embodiments, the memory structure 300D is a perspective view following operation 220 of the method 200 (FIG. 2). In comparison with the memory structure 300C (FIG. 3C), the memory structure 300D includes a conductive line 185 electrically connected to the gate structure (labeled in FIG. 3A). In some embodiments, the conductive line 185 is capable of functioning as a write line. The memory structure 300D further includes a plurality of conductive lines 144 and 154. The conductive lines 144 and 154 are usable as program lines. In some embodiments, the conductive line 154 is shorter than other conductive lines 144. In some embodiments, all conductive lines 144 and 154 have a same length. In some embodiments, all of the conductive lines 144 and 154 extend in a same direction as the conductive line 185. In some embodiments, at least one conductive line 144 and 154 extend in a different direction from the conductive line 185.

Returning to FIG. 2, in operation 225 a back gate of a read transistor is formed in electrical connection with the array of storage elements. In some embodiments, the back gate is formed by etching an opening in a dielectric layer, such as an IMD layer, of an interconnect structure and filling the opening with a conductive material. In some embodiments, the back gate is formed by depositing a conductive material and etching the conductive material to define the back gate. In some embodiments, the conductive material is deposited using a plating process, a PVD process, a CVD process, or another suitable process. In some embodiments, the back gate is formed using a damascene process.

Figures 3E, 3F:
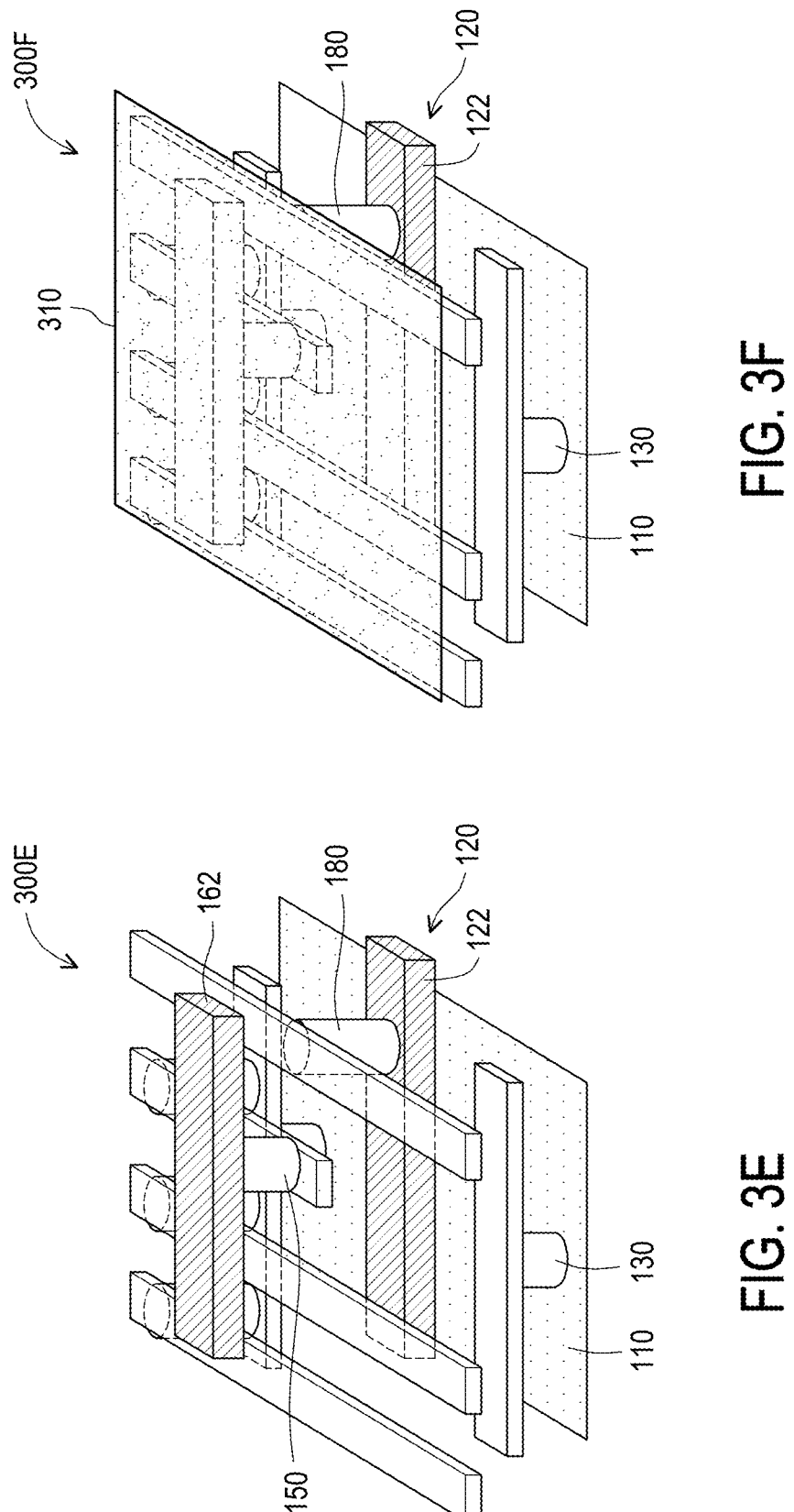

FIG. 3E is a perspective view of a memory structure 300E at an intermediate stage of manufacture, in accordance with some embodiments. In some embodiments, the memory structure 300E is a perspective view following operation 225 of the method 200 (FIG. 2). In comparison with the memory structure 300D (FIG. 3D), the memory structure 300E includes a gate 162 electrically connected to the conductive line 154 (labeled in FIG. 3D). The gate 162 is electrically connected to each of the storage elements 142 (labeled in FIG. 3C) through the conductive line 136 (labeled in FIG. 3B).

Returning to FIG. 2, in operation 230, a gate dielectric layer is formed over the back gate. In some embodiments, the gate dielectric layer is formed using a CVD process or another suitable process. In some embodiments, the gate dielectric layer is formed simultaneously with forming of a dielectric layer, such as an IMD layer, in the interconnect structure. In some embodiments, the gate dielectric layer is formed before or after forming a dielectric layer, such as an IMD layer, in the interconnect structure. In some embodiments, the gate dielectric layer includes silicon oxide, silicon nitride, silicon oxynitride or another suitable dielectric material. In some embodiments, the gate dielectric layer includes a same material as a dielectric layer, such as an IMD layer, of the interconnect structure. In some embodiments, the gate dielectric layer includes a different material from a dielectric layer, such as an IMD layer, of the interconnect structure. In some embodiments, forming the gate dielectric layer includes an etching process to define a boundary of the gate dielectric layer.

FIG. 3F is a perspective view of a memory structure 300F at an intermediate stage of manufacture, in accordance with some embodiments. In some embodiments, the memory structure 300F is a perspective view following operation 230 of the method 200 (FIG. 2). In comparison with the memory structure 300E (FIG. 3E), the memory structure 300F includes a gate dielectric layer 310 over the gate 162 (labeled in FIG. 3E). The gate dielectric layer 310 separates the gate 162 from a later formed channel layer.

Returning to FIG. 2, in operation 235, a contact is formed extending through the gate dielectric layer to electrically connect to the bit line. In some embodiments, the contact is formed by etching the gate dielectric layer to define an opening. In some embodiments, the opening extends through one or more IMD layers of the interconnect structure in addition to the gate dielectric layer. The opening is then filled with a conductive material to define the contact. In some embodiments, the conductive material is deposited using a plating process, a PVD process, a CVD process, or another suitable process.

Figures 3G, 3H:
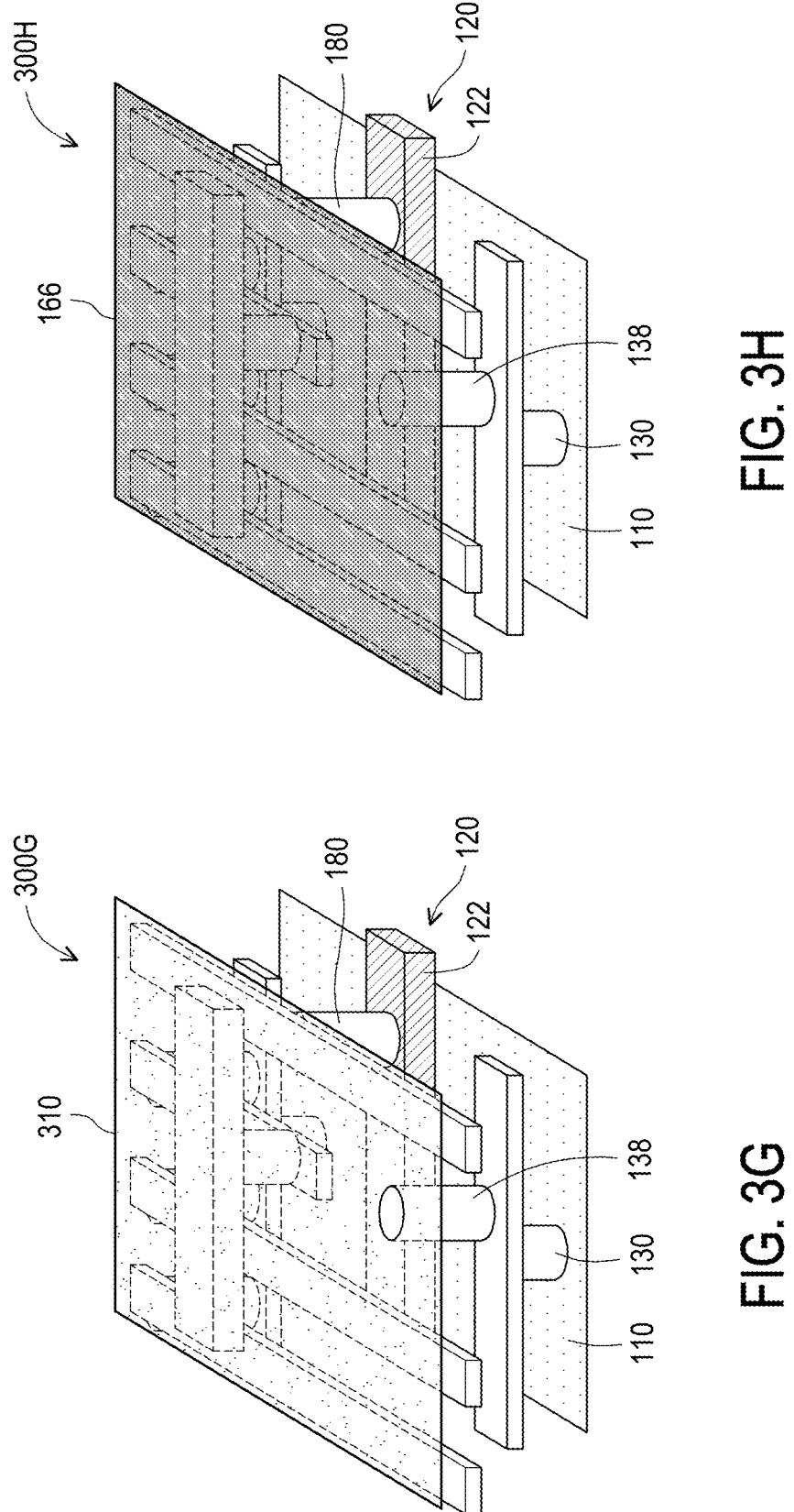

FIG. 3G is a perspective view of a memory structure 300G at an intermediate stage of manufacture, in accordance with some embodiments. In some embodiments, the memory structure 300G is a perspective view following operation 235 of the method 200 (FIG. 2). In comparison with the memory structure 300F (FIG. 3F), the memory structure 300G includes a via 138 extending through the gate dielectric layer 310 (labeled in FIG. 3F) and electrically connected to the conductive line 134 (labeled in FIG. 3B). The via 138 provides an electrical signal to an S/D region of a later formed channel layer.

Returning to FIG. 2, in operation 240, a channel layer is formed over the gate dielectric layer and in electrical connection with the contact formed in operation 235. In some embodiments, the channel layer is formed by depositing a semiconductor layer over the gate dielectric layer. In some embodiments, the channel layer is deposited using a CVD process, or another suitable process. In some embodiments, the channel layer is formed by depositing a seed layer over the gate dielectric layer and performing an epitaxial process to grow the semiconductor layer. In some embodiments, the channel layer is doped in-situ during deposition of the channel layer. In some embodiments, the channel layer is doped using one or more implantation processes. The channel layer includes a channel region and a plurality of S/D regions, where the S/D regions have a higher dopant concentration that the channel region. In some embodiments, the channel layer further includes other components, such as LDD regions, halo regions or other suitable regions. In some embodiments, forming the channel layer further includes at least one etching process to define a boundary of the channel layer.

FIG. 3H is a perspective view of a memory structure 300H at an intermediate stage of manufacture, in accordance with some embodiments. In some embodiments, the memory structure 300H is a perspective view following operation 240 of the method 200 (FIG. 2). In comparison with the memory structure 300G (FIG. 3G), the memory structure 300H includes a channel layer 166 the gate dielectric layer 310 (labeled in FIG. 3F) and electrically connected to the via 138 (labeled in FIG. 3G). The channel layer 166 is configured to function as a channel for a transistor to selectively connect S/D regions within the channel layer.

Returning to FIG. 2, in operation 245, a source line is formed connected to the channel layer of the read transistor. The source line is formed as a conductive line in an interconnect structure attached to the read transistor. In some embodiments, the source line is formed using an etching process to define an opening in a dielectric layer, such as an IMD layer, of the interconnect structure. The opening is then filled with a conductive material to define the source line. In some embodiments, the source line is formed using a dual damascene process.

Figure 3I:
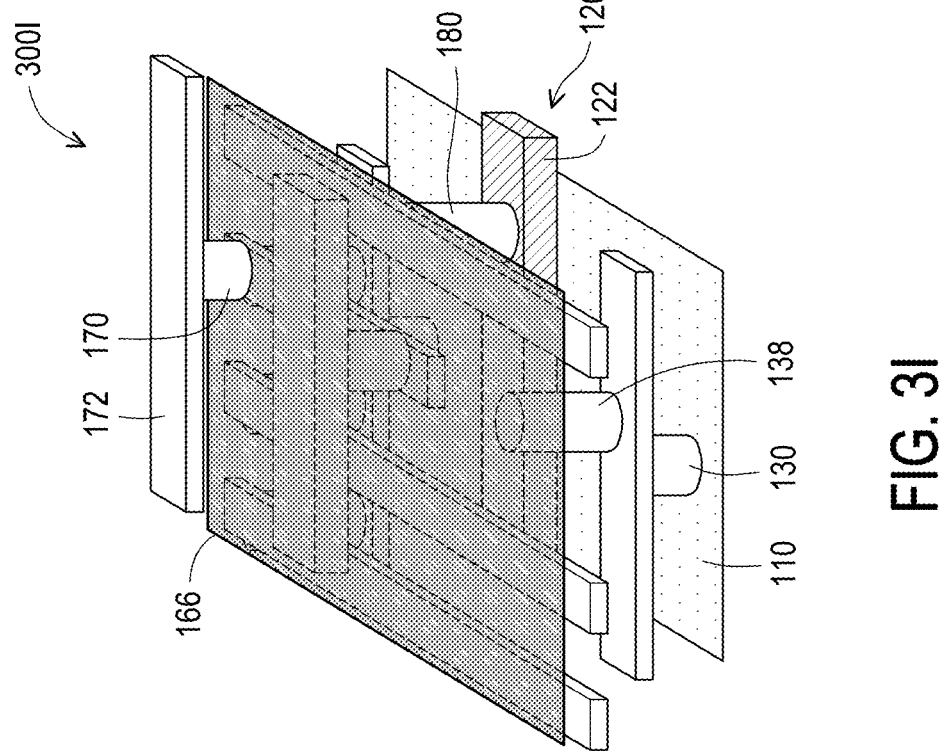

FIG. 3I is a perspective view of a memory structure 300I at an intermediate stage of manufacture, in accordance with some embodiments. In some embodiments, the memory structure 300I is a perspective view following operation 245 of the method 200 (FIG. 2). In comparison with the memory structure 300H (FIG. 3H), the memory structure 300I includes a conductive line 172 connected to the channel layer 166 (labeled in FIG. 3H) by a via 170. The conductive line 172 is capable of functioning as a source line.

One of ordinary skill in the art would understand that modifications to the method 200 are possible. In some embodiments, an order of operations of the method 200 is changed. For example, in some embodiments, the operation 235 is performed prior to the operation 230. In some embodiments, at least one additional operation is included in the method 200. For example, in some embodiments, the method 200 includes operations for routing power supply and reference voltages to components of the memory structure. In some embodiments, at least one operation of the method 200 is excluded. For example, in some embodiments, the operation 235 is omitted. Other modifications to the method 200 are within the scope of this disclosure.

Figure 4:
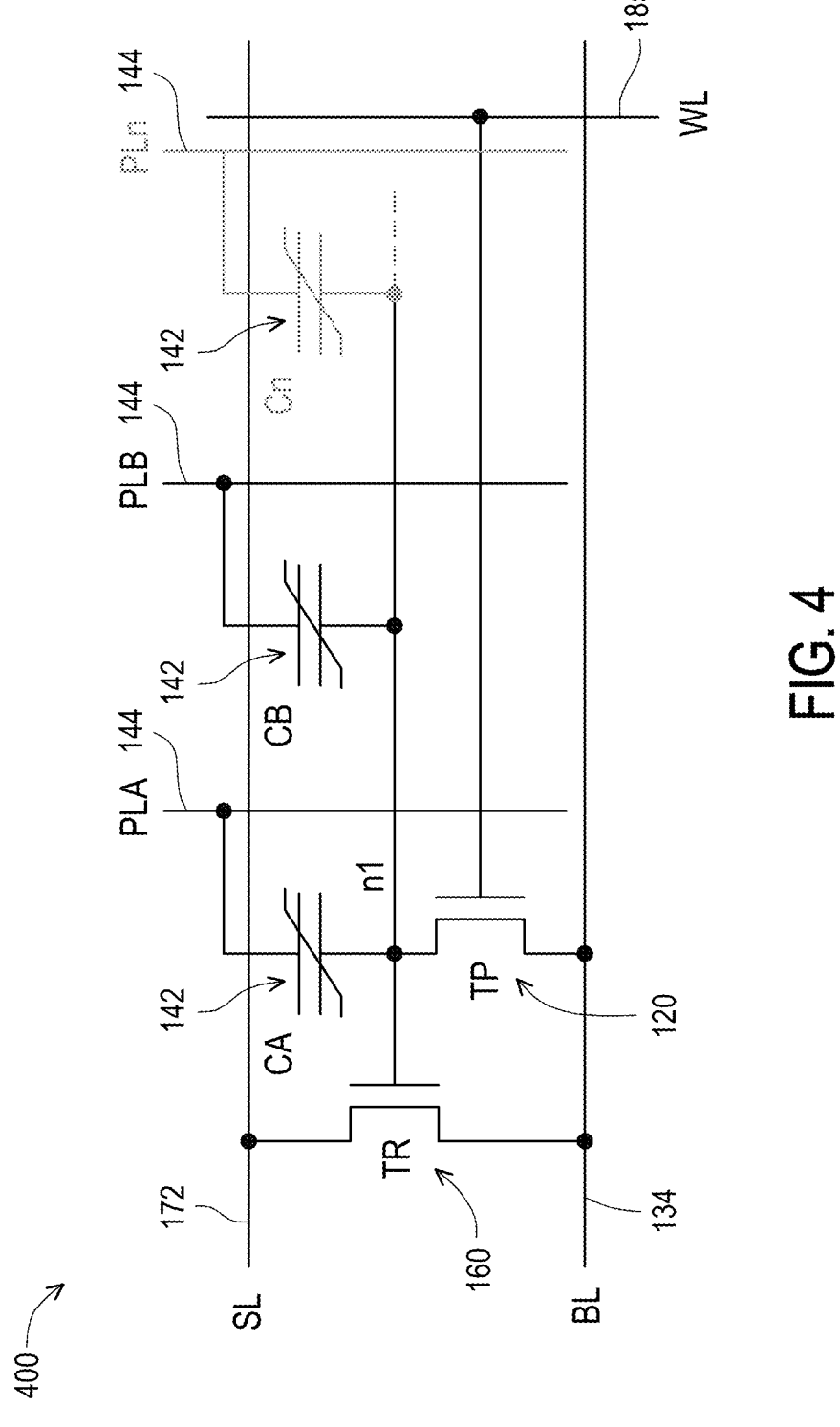
FIG. 4 is a schematic view of a memory structure, in accordance with some embodiments.

FIG. 4 is a schematic view of a memory structure 400 in accordance with some embodiments. Elements of the memory structure 400 that correspond to elements of the memory structure 100 (FIG. 1B) have the same reference number. In some embodiments, the memory structure 400 is a schematic representation of the structure of the memory structure 100 (FIG. 1B). In some embodiments, the memory structure 400 is formed using the method 200 (FIG. 2). In some embodiments, the memory structure 400 have a different structure from the memory structure 100; or is formed by a different method from the method 200.

The memory structure 400 includes a read transistor 160 electrically connected between a bit line 134 and a source line 172. The memory structure 400 further includes a write transistor 120 electrically connected between the bit line 134 and a plurality of storage elements 142. A gate of the read transistor 160 is electrically connected to a S/D region of the write transistor 120. A gate of the write transistor 120 is electrically connected to a word line 185. Each of the plurality of storage elements 142 are electrically connected between the gate of the read transistor 160 and a corresponding program line 144 of a plurality of program lines. The memory structure 400 includes three storage elements 142. In some embodiments, the memory structure 400 includes more or less than three storage elements 142.

During a write operation, the write line 185 is controlled to carry a power supply voltage, such as VDD; the bit line 134 is controlled to carry the power supply voltage; the source line 172 is controlled to carry a reference voltage, such as VSS; and each of the program lines 144 is controlled to carry the reference voltage. Thus, in some embodiments, during a write operation of, e.g., a ferroelectric RAM device, a voltage is applied to a ferroelectric layer by the program lines and the encoded bit is determined by the orientation of a residual polarization of the ferroelectric material after the voltage applied to the ferroelectric material has been removed. During a read operation, the write line 185 is controlled to carry the reference voltage; the bit line 134 is controlled to carry the power supply voltage; the source line 172 is controlled to carry the reference voltage; and each of the program lines 144 is configured to carry the reference voltage. Thus, in some embodiments, during a read operation of, e.g., a ferroelectric RAM device, a voltage is applied to the ferroelectric material and an output current is measured. According to some embodiments, reading the output current is a destructive process, and the cell value is automatically rewritten after being read. During a hold operation, the write line 185 is controlled to carry the reference voltage; the bit line 134 is controlled to carry a hold voltage, such as ½ VDD; the source line 172 is controlled to carry the hold voltage; and each of the program lines 144 is controlled to carry the reference voltage.

Figure 5:
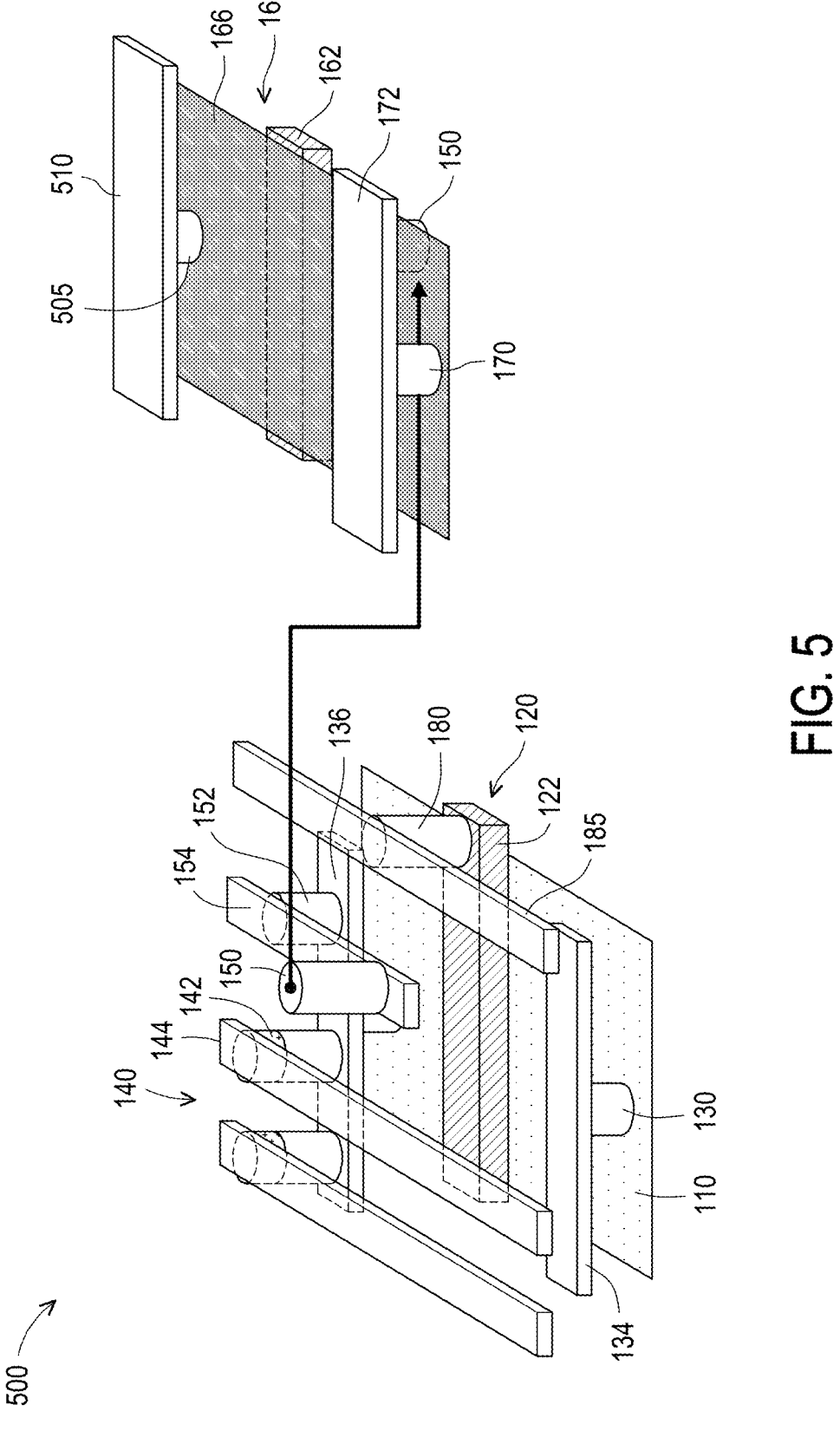
FIG. 5 is a perspective view of a memory structure, in accordance with some embodiments.

FIG. 5 is a perspective view of a memory structure 500, in accordance with some embodiments. Components of the memory structure 500 that are similar to the memory structure 100 (FIG. 1B) have a same reference number. Components of the memory structure 500 that are similar to the memory structure 100 are not discussed in detail here for the sake of brevity.

In comparison with the memory structure 100 (FIG. 1B), the memory structure 500 does not include a via 138 (FIG. 1B) electrically connecting the conductive line 134 to the channel layer 166. The memory structure 500 still includes the via 170 and the conductive line 172 electrically connected to the channel layer 166. In some embodiments, the via 170 and the conductive line 172 are connected to an opposite S/D region of the channel layer 166 in comparison with the memory structure 100 (FIG. 1B). The conductive line 172 is still capable of functioning as the source line. The memory structure 500 includes a via 505 and a conductive line 510 connected to an S/D region of the channel layer 166. In some embodiments, the conductive line 510 is configured to carry a reference voltage, such as VSS.

The via 505 is configured to electrically connect the second S/D region of the channel layer 166 to conductive line 510. In some embodiments, the via 505 includes copper, cobalt, aluminum, tungsten, alloys thereof, or other suitable conductive materials. In some embodiments, the via 505 includes a same material as the contact 130, the contact 132, the conductive line 134, the conductive line 136, the conductive line 144, the via 150, the via 170 and the conductive line 172. In some embodiments, the via 505 includes a different material from at least one of the contact 130, the contact 132, the conductive line 134, the conductive line 136, the conductive line 144, the via 150, the via 170, or the conductive line 172.

The conductive line 510 is configured to electrically connect the second S/D region of the channel layer 166 to a reference voltage, such as VSS. In some embodiments, the conductive line 510 includes copper, cobalt, aluminum, tungsten, alloys thereof, or other suitable conductive materials. In some embodiments, the conductive line 510 includes a same material as the contact 130, the contact 132, the conductive line 134, the conductive line 136, the conductive line 144, the via 150, the via 170, the conductive line 172, and the via 505. In some embodiments, the via 505 includes a different material from at least one of the contact 130, the contact 132, the conductive line 134, the conductive line 136, the conductive line 144, the via 150, the via 170, the conductive line 172, or the via 505.

Similar to the memory structure 100 (FIG. 1B), by using the three-dimensional stacking structure of the first transistor 120 and the second transistor 160, the memory structure 500 has a reduced size on the substrate 110 in comparison with other approaches that include both the transistors directly on the substrate. In some embodiments, positioning the second transistor 160 as the read transistor as being separated from the substrate helps to reduce the size of the memory structure 500 while continuing to provide sufficient write current through the first transistor 120 to precisely control the plurality of storage elements 140. This arrangement helps to ensure that data is reliably recorded on the memory structure 500. The reduced sized for the memory structure 500 helps to facilitate reduction is size of a memory array usable in other devices. The reduced size of the memory array helps to either provide additional memory storage capabilities in a same space or to provide additional functionality from other components for the overall device.

FIG. 6 is a flowchart of a method 600 of making a memory structure, in accordance with some embodiments. In some embodiments, the method 600 is usable to manufacture the memory structure 500 (FIG. 5). In some embodiments, the method 600 is usable to manufacture a memory structure different from the memory structure 500 (FIG. 5). The method 600 includes similar operations as the method 200 (FIG. 2). Similar operations have a same reference number and are not described here for the sake of brevity. In comparison with the method 200, the method 600 does not include operation 235 (FIG. 2). The method 600 does includes operation 610.

In operation 610, a conductive line is formed to electrically connect the channel layer to a reference voltage. The conductive line is formed as a conductive line in an interconnect structure attached to the read transistor. In some embodiments, the conductive line is formed using an etching process to define an opening in a dielectric layer, such as an IMD layer, of the interconnect structure. The opening is then filled with a conductive material to define the conductive line. In some embodiments, the conductive line is formed using a dual damascene process. In some embodiments, the conductive line is called a ground line and the reference voltage is VSS. In some embodiments, the conductive line corresponds to the conducive line 510 (FIG. 5). In some embodiments, the operation 610 further includes forming a via, e.g., via 505 (FIG. 5), to electrically connect the conductive line to the channel layer.

FIG. 7A is a cross-sectional view of a storage element 700A, in accordance with some embodiments. The storage element 700A includes a top conductive layer 710 and a bottom conductive layer 720. A ferroelectric layer 730 and an oxide layer 740 are between the top conductive layer 710 and the bottom conductive layer 720.

The top conductive layer 710 is configured to electrically connect the storage element 700A to a conductive line or via, e.g., the conductive line 144 (FIG. 1B). In some embodiments, the top conductive layer 710 is integral with the conductive line. In some embodiments, the top conductive layer 710 is different from the conductive line, but still electrically connected to the conductive line. In some embodiments, the top conductive layer 710 includes copper, aluminum, tungsten, cobalt, alloys thereof, or other suitable conductive materials.

The bottom conductive layer 720 is configured to electrically connect the storage element 700A to a conductive line or via, e.g., the conductive line 136 (FIG. 1B). In some embodiments, the bottom conductive layer 720 is integral with the conductive line. In some embodiments, the bottom conductive layer 720 is different from the conductive line, but still electrically connected to the conductive line. In some embodiments, the bottom conductive layer 720 includes copper, aluminum, tungsten, cobalt, alloys thereof, or other suitable conductive materials. In some embodiments, the bottom conductive layer 720 includes a same material as the top conductive layer 710. In some embodiments, the bottom conductive layer 720 includes a different material from the top conductive layer 710.

The ferroelectric layer 730 is between the top conductive layer 710 and the bottom conductive layer 720. The ferroelectric layer 730 is configured to change electrical polarization in response to an applied field to the top conductive layer 710 and the bottom conductive layer 720. According to some embodiments, the electrical polarization of the ferroelectric layer 730 persists after a write operation, as described above, and does not consume further power to maintain stored or embedded data in the ferroelectric layer 730. Based on this electrical field, a resistance of the storage element 700A is controllable. By controlling the resistance, data is storable in the storage element 700A. This information is able to be read out by passing a current through the storage element 700A and measuring a resulting voltage. In some embodiments, the ferroelectric layer includes potassium dihydrogen phosphate, barium titanate or other suitable ferroelectric materials.

The oxide layer 740 is between the ferroelectric layer 730 and the bottom conductive layer 720. The oxide layer 740 is usable to help control the electrical field applied to the ferroelectric layer 730 to adjust the electrical polarization of the ferroelectric layer 730. In some embodiments, the oxide layer 740 includes silicon oxide. In some embodiments, the oxide layer 740 includes a different oxide, such as silicon oxynitride.

FIG. 7B is a cross-sectional view of a storage element 700B, in accordance with some embodiments. The storage element 700B is similar to the storage element 700A (FIG. 7A). Similar elements have the same reference numbers and are not described here for the sake of brevity. In comparison with the storage element 700A (FIG. 7A), the storage element 700B includes ferroelectric layer 750. The ferroelectric layer 750 is configured to change electrical polarization in response to an applied field to the top conductive layer 710 and the bottom conductive layer 720. Based on this electrical field, a resistance of the storage element 700B is controllable. By controlling the resistance, data is storable in the storage element 700B. This information is able to be read out by passing a current through the storage element 700B and measuring a resulting voltage. In some embodiments, the ferroelectric layer includes potassium dihydrogen phosphate, barium titanate or other suitable ferroelectric materials. A thickness T1 of the ferroelectric layer 750 is less than 5 nm. In some embodiments, the thickness T1 of the ferroelectric layer 750 ranges from about 0.5 nm to about 5 nm. If the thickness of the ferroelectric layer 750 is too small, then the ferroelectric layer 750 is unable to control resistance of the storage element 700B, in some instances. If the thickness of the ferroelectric layer 750 is too large, then the ferroelectric layer 750 controls capacitance of the storage element 700B instead of resistance, in some instances.

FIG. 7C is a cross-sectional view of a storage element 700C, in accordance with some embodiments. The storage element 700C is similar to the storage element 700A (FIG. 7A). Similar elements have the same reference numbers and are not described here for the sake of brevity. In comparison with the storage element 700A (FIG. 7A), the storage element 700C includes ferroelectric layer 760. The ferroelectric layer 760 is configured to change electrical polarization in response to an applied field to the top conductive layer 710 and the bottom conductive layer 720. Based on this electrical field, a capacitance of the storage element 700C is controllable. By controlling the capacitance, data is storable in the storage element 700C. This information is able to be read out by passing a current through the storage element 700C and measuring a resulting voltage. In some embodiments, the ferroelectric layer includes potassium dihydrogen phosphate, barium titanate or other suitable ferroelectric materials. A thickness T2 of the ferroelectric layer 760 ranges from about 5 nm to about 15 nm. If the thickness of the ferroelectric layer 760 is too small, then the ferroelectric layer 760 controls a resistance of the storage element 700C instead of the capacitance, in some instances. If the thickness of the ferroelectric layer 760 is too large, then control of the capacitance the storage element 700C take a longer time, which increases a write time for the storage element 700C, in some instances.

In some embodiments, the storage elements 700A-700C are usable with the memory structure 100 (FIG. 1B) or the memory structure 500 (FIG. 5). One of ordinary skill in the art would understand that other storage element structures are within the scope of this description and are usable with the memory structure 100 (FIG. 1B) or the memory structure 500 (FIG. 5).

Figure 8:
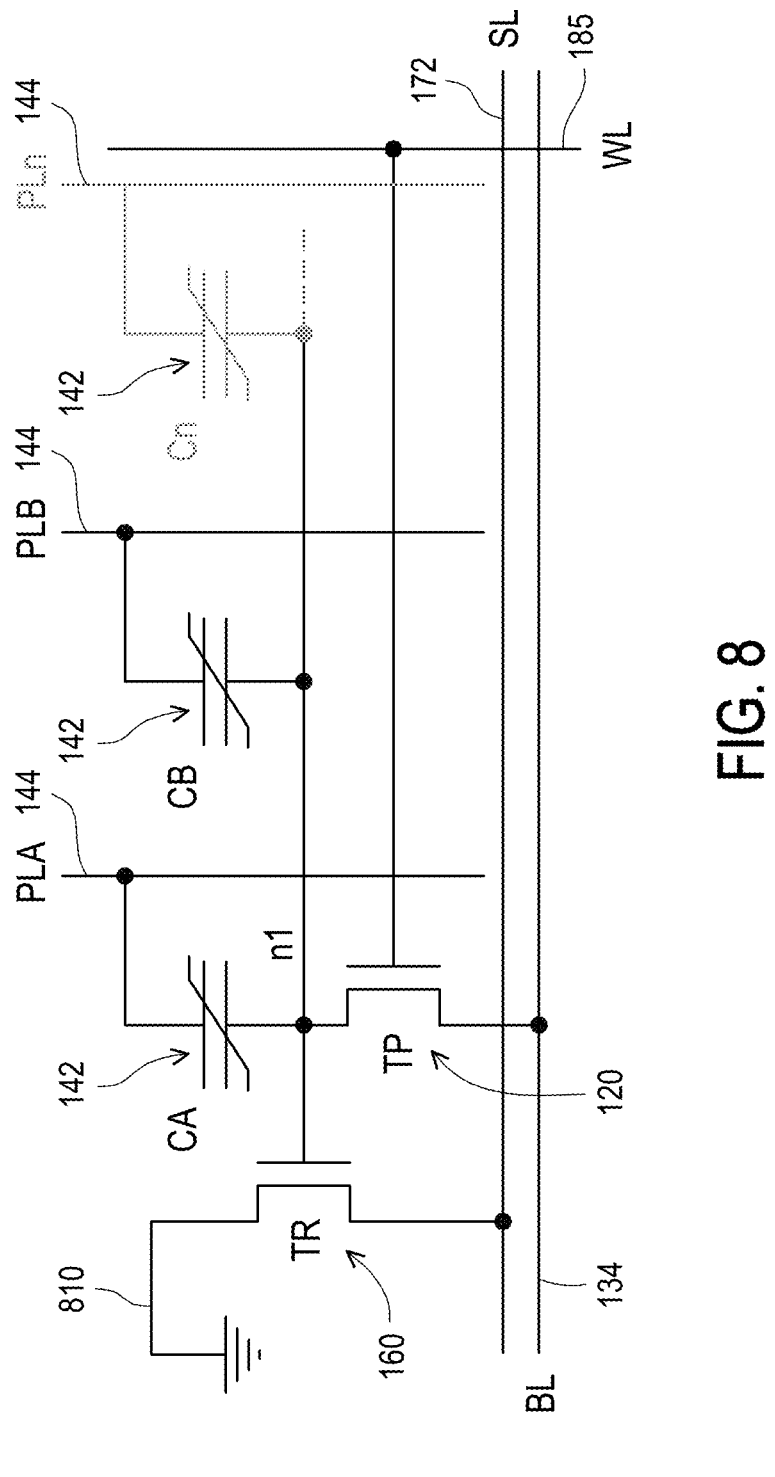
FIG. 8 is a schematic view of a memory structure, in accordance with some embodiments.

FIG. 8 is a schematic view of a memory structure 800 in accordance with some embodiments. Elements of the memory structure 800 that correspond to elements of the memory structure 500 (FIG. 5) have the same reference number. In some embodiments, the memory structure 800 is a schematic representation of the structure of the memory structure 500 (FIG. 5). In some embodiments, the memory structure 800 is formed using the method 600 (FIG. 6). In some embodiments, the memory structure 800 has a different structure from the memory structure 500; or is formed by a different method from the method 600.

The memory structure 800 includes a read transistor 160 electrically connected between a source line 172 and a reference line 810. According to some embodiments, a read transistor is manufactured by a FEOL process and is located closer to the substrate than the memory structure storage cells or the write transistor. The memory structure 800 further includes a write transistor 120 electrically connected between the bit line 134 and a plurality of storage elements 142. According to some embodiments, the write transistor of a memory structure is manufactured by a BEOL process and is located at a location above the storage cells of the memory structure, and above the read transistor (see, e.g., read transistor 160), wherein the substrate is located below the read transistor and below the storage cells). A gate of the read transistor 160 is electrically connected to a S/D region of the write transistor 120. A gate of the write transistor 120 is electrically connected to a word line 185. Each of the plurality of storage elements 142 are electrically connected between the gate of the read transistor 160 and a corresponding program line 144 of a plurality of program lines. The memory structure 800 includes three storage elements 142. In some embodiments, the memory structure 800 includes more or less than three storage elements 142.

During a write operation, the write line 185 is controlled to carry a power supply voltage, such as VDD; the bit line 134 is controlled to carry the power supply voltage; the source line 172 is controlled to carry a reference voltage, such as VSS; and each of the program lines 144 is controlled to carry the reference voltage. During a read operation, the write line 185 is controlled to carry the reference voltage; the bit line 134 is controlled to carry the power supply voltage; the source line 172 is controlled to carry the power supply voltage; and each of the program lines 144 is configured to carry the reference voltage. During a hold operation, the write line 185 is controlled to carry the reference voltage; the bit line 134 is controlled to carry the reference voltage; the source line 172 is controlled to carry the reference voltage; and each of the program lines 144 is controlled to carry the reference voltage.

Figure 9:
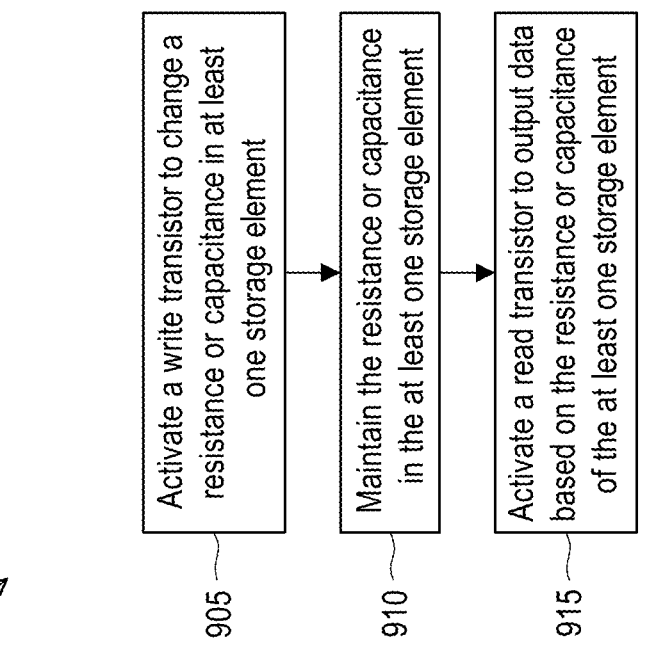
FIG. 9 is a flowchart of a method of using a memory structure, in accordance with some embodiments.

FIG. 9 is a flowchart of a method 900 of using a memory structure, in accordance with some embodiments. In some embodiments, the method 900 is performed using the memory structure 100 (FIG. 1B), the memory structure 400 (FIG. 4), the memory structure 500 (FIG. 5), or the memory structure 800 (FIG. 8). In some embodiments, the method 900 is performed using a memory structure other than the memory structure 100, the memory structure 400, the memory structure 500, or the memory structure 800.

In operation 905, a write transistor is activated to change a resistance or capacitance in at least one storage element. The write transistor is activated by applied a power supply voltage, such as VDD, to a gate of the write transistor. The changing of the resistance or capacitance is performed by applying the power supply voltage to a bit line. A source line and each of the program lines electrically connected to a corresponding storage element of the at least one storage element are connected to a reference voltage, such as VSS. In some embodiments, the resistance or capacitance is changed in more than one storage element. In some embodiments, the write transistor includes the first transistor 120 (FIG. 1B or FIG. 5). In some embodiments, the at least one storage element includes any of the storage elements 700A-700C (FIGS. 7A-7C).

In operation 910, the resistance or capacitance of the at least one storage element is maintained. The resistance or capacitance of the at least one store element is maintained by de-activating the write transistor by applying the reference voltage to the gate of the write transistor. Each of the program lines electrically connected to a corresponding one of the at least one storage element is also connected to the reference voltage. In some embodiments, the bit line and the source line are each connected to a holding voltage, such as ½ VDD. In some embodiments, the bit line and the source line are each connected to the reference voltage.

In operation 915, a read transistor is activated to output data based on the resistance or capacitance of the least one storage element. The read transistor is a different distance from a substrate than the write transistor. During the read operation, the write line and each of the program lines connected to a corresponding one of the at least one storage elements are connected to the reference voltage. During the read operation, the bit line is connected to the power supply voltage. In some embodiments, the source line is connected to the power supply voltage. In some embodiments, the source line is connected to the reference voltage. In some embodiments, the read transistor corresponds to the second transistor 160 (FIG. 1B or FIG. 5).

In some embodiments, the method 900 includes additional operations. For example, in some embodiments, the method 900 includes one or more processing operations to determine whether the voltage output by the read operation corresponds to a 0 or a 1. In some embodiments, an order of operations of the method 900 is adjusted. For example, in some embodiments, the operation 910 is performed prior to the operation 905. One of ordinary skill in the art would recognize that additional modifications to the method 900 are within the scope of this disclosure.

An aspect of this description relates to a memory structure. The memory structure includes a substrate. The memory structure further includes a first transistor, wherein the first transistor is a first distance from the substrate. The memory structure further includes a second transistor, wherein the second transistor is a second distance from the substrate, and the first distance is different from the second distance, and a first source/drain (S/D) region of the first transistor is connected to a second S/D region of the second transistor. The memory structure further includes a plurality of storage elements electrically connected to both the first transistor and the second transistor, wherein each of the plurality of storage elements is a third dance from the substrate, and the third distance is different from both the first distance and the second distance. In some embodiments, the first transistor is a write transistor. In some embodiments, the second transistor is a read transistor. In some embodiments, the third distance is between the first distance and the second distance. In some embodiments, the second transistor includes a gate; and a channel layer, wherein the gate is between the channel layer and the substrate. In some embodiments, the memory structure further includes a bit line, wherein the bit line is electrically connected between the first S/D region and the second S/D region. In some embodiments, the memory structure further includes a source line, wherein the source line is connected to the second transistor, and the second transistor is between the source line and the substrate. In some embodiments, the memory structure further includes a reference voltage carrying conductive line electrically connected to the second transistor, wherein the second transistor is between the reference voltage carrying conductive line and the substrate. In some embodiments, the memory structure further includes a bit line, wherein the bit line is selectively electrically connectable to the second transistor. In some embodiments, the second transistor is directly above the first transistor in a plan view.

An aspect of this description relates to a semiconductor device. The semiconductor device includes a substrate. The semiconductor device further includes a write transistor partially in the substrate. The semiconductor device further includes an interconnect structure over the substrate. The semiconductor device further includes a read transistor entirely within the interconnect structure. The semiconductor device further includes at least one storage element electrically connected to the write transistor and to the read transistor, wherein the write transistor is configured to control each of the at least one storage element, and the read transistor is configured to output a signal based on each of the least one storage element. In some embodiments, each of the at least one storage element includes a ferroelectric random-access memory (FeRAM). In some embodiments, each of the at least one storage element includes a ferroelectric tunneling junction (FTJ). In some embodiments, the at least one storage element is physically between the write transistor and the read transistor. In some embodiments, the semiconductor device further includes a bit line, wherein the bit line is permanently electrically connected to each of the read transistor and the write transistor. In some embodiments, the semiconductor device further includes a bit line, wherein the bit line is selectively electrically connected to the read transistor. In some embodiments, the read transistor includes a gate; and a channel layer, wherein the gate is between the channel layer and the substrate.

An aspect of this description relates to a method of making a semiconductor device. The method includes forming a write transistor partially in a substrate. The method further includes forming an interconnect structure over the substrate. The method further includes forming a read transistor in the interconnect structure, wherein the read transistor is physically separated from the substrate. The method further includes forming at least one storage element electrically connected to each of the write transistor and the read transistor, wherein forming the at least one storage element comprises forming the at least one storage element between the write transistor and the read transistor in a direction perpendicular to a top surface of the substrate. In some embodiments, the method further includes forming a bit line in the interconnect structure, wherein forming the bit line includes forming the bit line permanently electrically connected to each of the read transistor and the write transistor. In some embodiments, the method further includes forming a bit line in the interconnect structure, wherein forming the bit line includes forming the bit line selectively electrically connected to the read transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure comprising:
a substrate;
a first transistor, wherein the first transistor is a first distance from the substrate;
a second transistor, wherein the second transistor is a second distance from the substrate, and the first distance is different from the second distance, and a first source/drain (S/D) region of the first transistor is connected to a second S/D region of the second transistor; and
a plurality of storage elements electrically connected to both the first transistor and the second transistor, wherein each of the plurality of storage elements is a third distance from the substrate, and the third distance is different from both the first distance and the second distance.

2. The memory structure of claim 1, wherein the first transistor is a write transistor.

3. The memory structure of claim 2, wherein the second transistor is a read transistor.

4. The memory structure of claim 1, wherein the third distance is between the first distance and the second distance.

5. The memory structure of claim 1, wherein the second transistor comprises:
a gate; and
a channel layer, wherein the gate is between the channel layer and the substrate.

6. The memory structure of claim 1, further comprising a bit line, wherein the bit line is electrically connected between the first S/D region and the second S/D region.

7. The memory structure of claim 1, further comprising a source line, wherein the source line is connected to the second transistor, and the second transistor is between the source line and the substrate.

8. The memory structure of claim 1, further comprising a reference voltage carrying conductive line electrically connected to the second transistor, wherein the second transistor is between the reference voltage carrying conductive line and the substrate.

9. The memory structure of claim 1, further comprising a bit line, wherein the bit line is selectively electrically connectable to the second transistor.

10. The memory structure of claim 1, wherein the second transistor is directly above the first transistor in a plan view.

11. A semiconductor device comprising:
a substrate;

a write transistor partially in the substrate;

an interconnect structure over the substrate;

a read transistor entirely within the interconnect structure; and at least one storage element electrically connected to the write transistor and to the read transistor, wherein the write transistor is configured to control each of the at least one storage element, and the read transistor is configured to output a signal based on each of the least one storage element.

12. The semiconductor device of claim 11, wherein each of the at least one storage element comprises a ferroelectric random-access memory (FeRAM).

13. The semiconductor device of claim 11, wherein each of the at least one storage element comprises a ferroelectric tunneling junction (FTJ).

14. The semiconductor device of claim 11, wherein the at least one storage element is physically between the write transistor and the read transistor.

15. The semiconductor device of claim 11, further comprising a bit line, wherein the bit line is permanently electrically connected to each of the read transistor and the write transistor.

16. The semiconductor device of claim 11, further comprising a bit line, wherein the bit line is selectively electrically connected to the read transistor.

17. The semiconductor device of claim 11, wherein the read transistor comprises:

a gate; and a channel layer, wherein the gate is between the channel layer and the substrate.

18. A memory structure comprising:

a substrate;

a first transistor, wherein the first transistor comprises a gate structure, a first source/drain (S/D) region, and a second S/D region;

a second transistor, wherein the second transistor has a gate electrode, and a gate dielectric, and the gate electrode is physically between the gate structure and the gate dielectric; and a storage element electrically connected to the first S/D region, wherein the storage element is physically between the first transistor and the second transistor.

19. The memory structure of claim 18, wherein the storage element is electrically connected to the gate electrode.

20. The memory structure of claim 18, wherein the second S/D region is electrically connected to the second transistor.

* * * * *